(12) United States Patent
Dieckmann et al.

(10) Patent No.: US 9,116,441 B2
(45) Date of Patent: Aug. 25, 2015

(54) ILLUMINATION SYSTEM OF A MICROLITHOGRAPHIC PROJECTION EXPOSURE APPARATUS

(75) Inventors: Nils Dieckmann, Huettlingen (DE); Manfred Maul, Aalen (DE); Christian Hettich, Aalen (DE); Oliver Natt, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 565 days.

(21) Appl. No.: 13/438,179

(22) Filed: Apr. 3, 2012

(65) Prior Publication Data

US 2012/0188527 A1    Jul. 26, 2012

Related U.S. Application Data

(60) Division of application No. 12/509,738, filed on Jul. 27, 2009, now Pat. No. 8,169,594, which is a continuation of application No. PCT/EP2008/000706, filed on Jan. 30, 2008.

(60) Provisional application No. 60/887,186, filed on Jan. 30, 2007.

(51) Int. Cl.
| G03B 27/54 | (2006.01) |
| G03B 27/72 | (2006.01) |
| G03F 7/20 | (2006.01) |

(52) U.S. Cl.
CPC .................... *G03F 7/70191* (2013.01)

(58) Field of Classification Search
CPC .................................................. G03F 7/70191
USPC ............ 355/52, 53, 55, 67–71; 356/399–401; 250/548; 359/890–892
See application file for complete search history.

(56) References Cited

U.S. PATENT DOCUMENTS

| 5,863,712 | A | 1/1999 | Von Bunau et al. |
| 6,535,274 | B2 | 3/2003 | Antoni |
| 7,196,774 | B2 * | 3/2007 | Won et al. ........................ 355/71 |
| 7,283,209 | B2 * | 10/2007 | Brotsack ........................ 355/71 |
| 7,940,375 | B2 * | 5/2011 | Fiolka et al. ..................... 355/71 |
| 2002/0075468 | A1 | 6/2002 | Antoni |
| 2003/0067591 | A1 | 4/2003 | Komatsuda |
| 2004/0207928 | A1 | 10/2004 | Schultz et al. |
| 2004/0257559 | A1 | 12/2004 | Dieckmann |
| 2006/0268251 | A1 | 11/2006 | Deguenther et al. |
| 2007/0229790 | A1 | 10/2007 | Kuechler et al. |

FOREIGN PATENT DOCUMENTS

| DE | 10 2004 063314 | 7/2006 |
| EP | 0 952 491 | 10/1999 |
| EP | 1 020 769 | 7/2000 |
| EP | 1 555 573 | 7/2005 |
| EP | 1 798 758 | 6/2007 |
| WO | WO 2005/006079 | 1/2005 |
| WO | WO 2005/015310 | 2/2005 |
| WO | WO 2005/119369 | 12/2005 |
| WO | WO 2006/018972 | 2/2006 |
| WO | WO 2006/114294 | 11/2006 |

OTHER PUBLICATIONS

The International Search Report for the corresponding PCT Application No. PCT/EP2008/000706, filed Jan. 30, 2008.

* cited by examiner

*Primary Examiner* — Hung Henry Nguyen
(74) *Attorney, Agent, or Firm* — Fish & Richardson P.C.

(57) ABSTRACT

An illumination system of a microlithographic projection exposure apparatus can include at least one transmission filter which has a different transmittance at least at two positions and which is arranged between a pupil plane and a field plane. The transmittance distribution can be determined such that it has field dependent correcting effects on the ellipticity. In some embodiments the telecentricity and/or the irradiance uniformity is not affected by this correction.

20 Claims, 18 Drawing Sheets

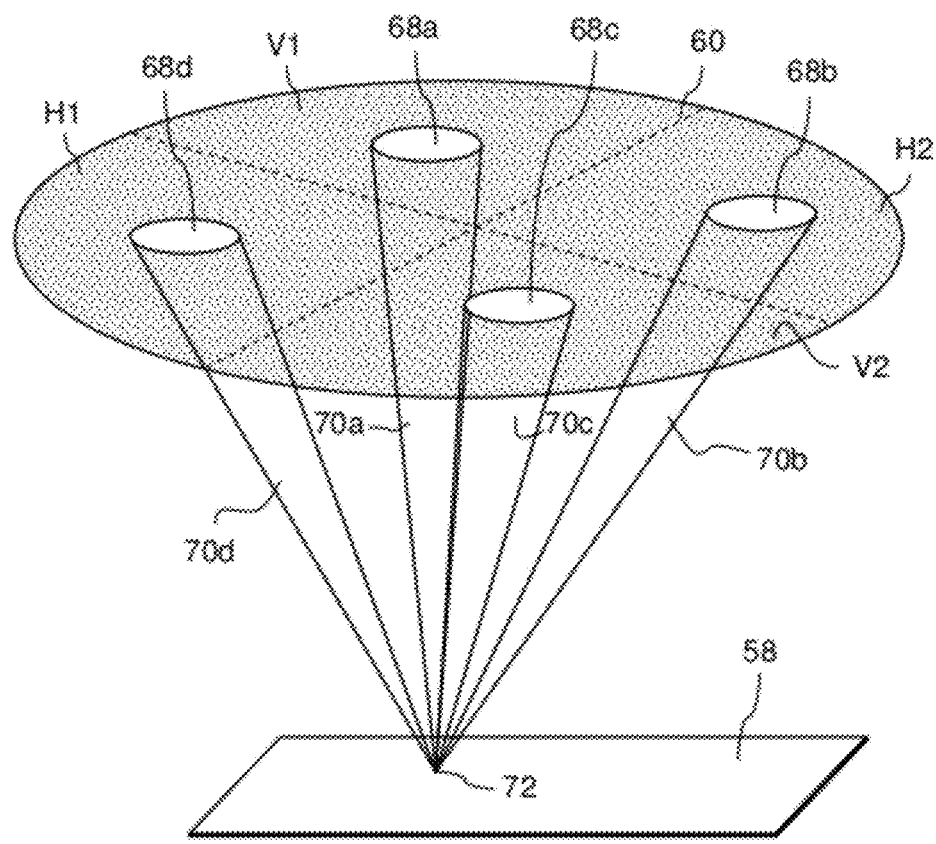
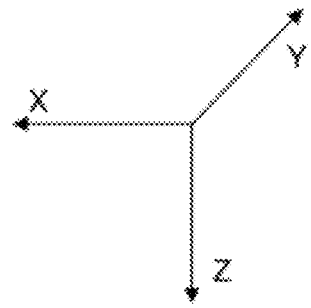
Fig. 3

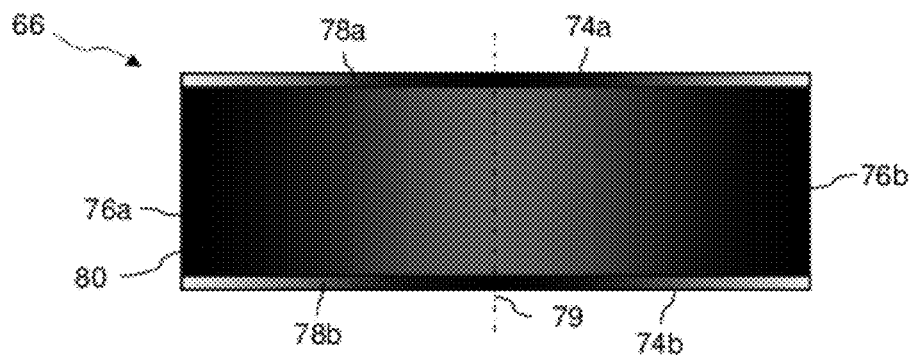
Fig. 6
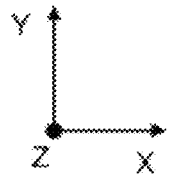
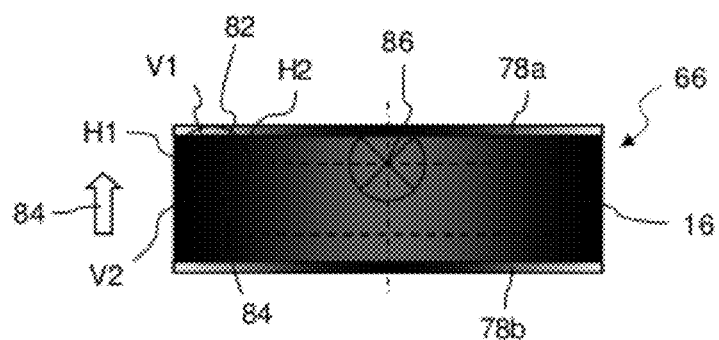
Fig. 7a
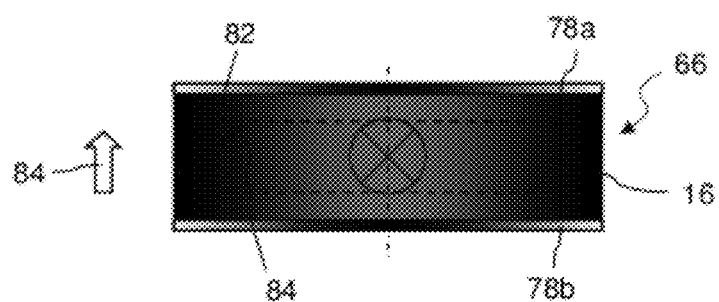
Fig. 7b
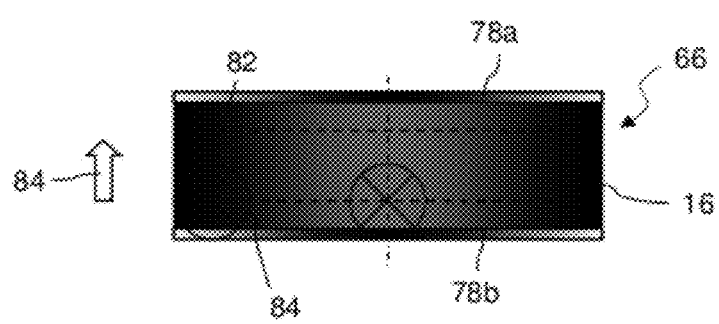
Fig. 7c

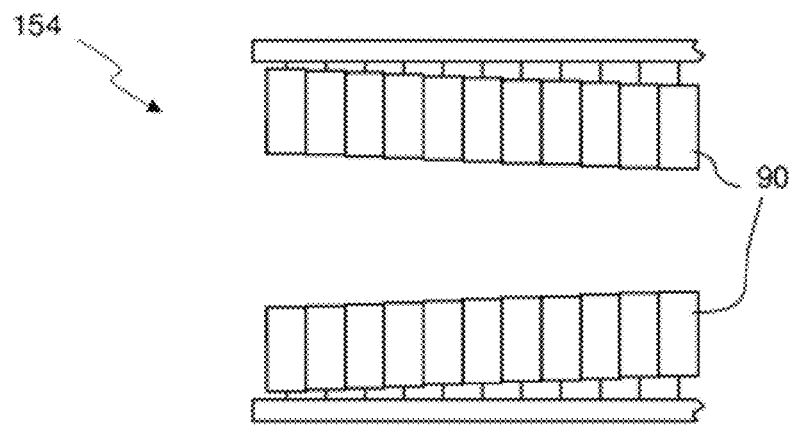
Fig. 10
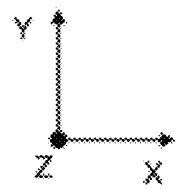
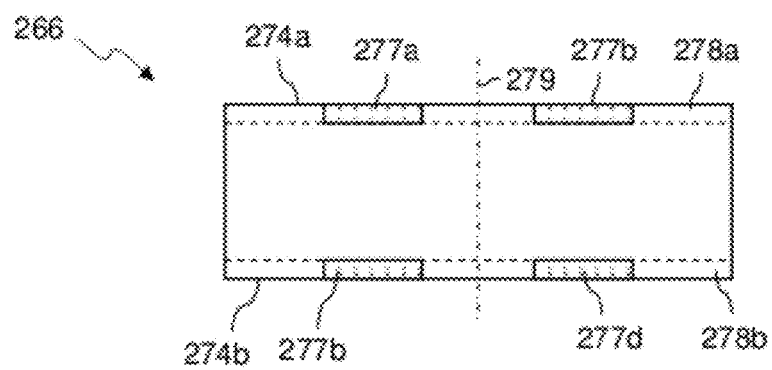
Fig. 11
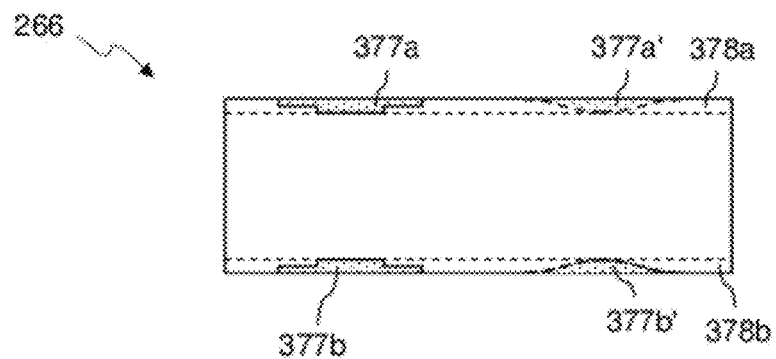
Fig. 12

ILLUMINATION SYSTEM OF A MICROLITHOGRAPHIC PROJECTION EXPOSURE APPARATUS

CROSS-REFERENCE TO RELATED APPLICATIONS

This application is a divisional application of U.S. application Ser. No. 12/509,738, filed Jul. 27, 2009, now U.S. Pat. No. 8,169,594, which is a continuation of, and claims benefit under 35 USC §120 to, international application PCT/EP2008/000706, filed Jan. 30, 2008, which claims benefit of U.S. Provisional Application No. 60/887,186, filed Jan. 30, 2007. U.S. application Ser. No. 12/509,738 and international application PCT/EP2008/000706 are hereby incorporated by reference in its entirety.

FIELD

The disclosure relates to an illumination system of a microlithographic projection exposure apparatus, including such an illumination system with which the illumination angle distribution of the light incident on the mask can be relatively symmetrised, as well as related microlithographic projection exposure apparatus and methods.

BACKGROUND

Integrated electrical circuits and other microstructured components are conventionally produced by applying a plurality of structured layers onto a suitable substrate which, for example, may be a silicon wafer. In order to structure the layers, they are first covered with a photoresist which is sensitive to light of a particular wavelength range, for example light in the deep ultraviolet (DUV) spectral range. The wafer coated in this way is subsequently exposed in a projection exposure apparatus. A pattern of diffracting structures, which is arranged on a mask, is thereby imaged onto the photoresist with the aid of a projection objective. Since the imaging scale is generally less than 1, such projection objectives are often also referred to as reducing objectives.

After the photoresist has been developed, the wafer is subjected to an etching process so that the layer becomes structured according to the pattern on the mask. The remaining photoresist is then removed from the other parts of the layer. This process is repeated until all the layers have been applied on the wafer.

The performance of the projection exposure apparatus being used, however, is generally determined not only by the imaging properties of the projection objective but also by an illumination system which illuminates the mask. To this end, the illumination system contains a light source, for example a laser operated in pulsed mode, and a plurality of optical elements which generate light bundles, converging on the mask at field points, from the light generated by the light source. The individual light bundles desirably have particular properties, which in general are adapted to the projection objective.

These properties include among other things the illumination angle distribution of the light bundles which respectively converge on a point in the mask plane. The term illumination angle distribution describes the way in which the overall intensity of a light bundle is distributed between the different directions in which the individual rays of the light bundle strike the relevant point in the mask plane. If the illumination angle distribution is specially adapted to the pattern contained in the mask, then the latter can be imaged with high imaging quality onto the wafer covered with photoresist.

The illumination angle distribution is often not described directly in the mask plane, in which the mask to be projected is placed, but instead as an intensity distribution in a pupil plane which has a Fourier relation with the mask plane. This utilises the fact that each angle with respect to the optical axis, at which a light ray passes through a field plane, can be assigned a radial distance measured from the optical axis in a Fourier-transformed pupil plane. In the case of a so-called conventional illumination setting, for example, the region illuminated in such a pupil plane is a circular disc concentric with the optical axis. Each point in the mask plane is therefore struck by light rays at angles of incidence of between 0° and a maximum angle dictated by the radius of the circular disc. In the case of so-called unconventional illumination settings, for example ring-field (or annular), dipole or quadrupole illumination, the region illuminated in the pupil plane has the shape of a ring concentric with the optical axis, or a plurality of individual regions (poles) which are arranged at a distance from the optical axis. With these unconventional illumination settings, therefore, the mask to be projected can be illuminated exclusively obliquely.

With conventional illumination settings and ring-field illumination, the illumination angle distribution is typically rotationally symmetric in the ideal case. With quadrupole illumination, although the illumination angle distribution is ideally not rotationally symmetric, in the ideal case the poles in the pupil plane are typically illuminated so that the illumination angle distribution has a fourfold symmetry. Expressed more simply, an equal amount of light from all four directions therefore strikes a field point in the mask plane.

The symmetry properties of the respective illumination angle distribution can contribute to achieving dimensionally accurate imaging of the structures contained on the masks. In the event of deviations from these symmetry properties, for example, structures which are equally wide but oriented differently on the mask (for example vertically or horizontally) may be imaged with a different width on the photoresist. This can compromise unimpaired function of the microlithographically produced components.

To better quantitatively describe deviations from the aforementioned ideal symmetry properties of the illumination angle distributions, the term pupil ellipticity is often used. Expressed simply, the pupil ellipticity corresponds to the ratio of the amounts of light which strike a field point on the mask from orthogonal directions during an exposure. The more the pupil ellipticity deviates from 1, the more asymmetric is the illumination angle distribution.

Another property of the light bundles striking the mask plane is the telecentricity. The term telecentric illumination is used when the energetically central rays of the light bundle, which are generally referred to as principal or centroid rays, pass perpendicularly through the mask plane. With non-telecentric illumination, the entire light bundle strikes the mask to some extent obliquely. For the illumination angle distribution, this means that the different amounts of light come from opposite directions. In general, telecentric illumination is desired since the projection objectives are usually also telecentric on the object side. When correcting the pupil ellipticity, therefore, the telecentricity is desirably generally preserved.

SUMMARY

In some embodiments, the disclosure provides an illumination system of a microlithographic projection exposure apparatus, with which deviations of an actual illumination angle distribution in the mask plane from a desired illumination angle distribution can be corrected field-dependently. For example, the illumination system can be capable of correcting the pupil ellipticity without thereby causing perturbations of the telecentric properties.

In certain embodiments, the disclosure provides an illumination system of a microlithographic projection exposure apparatus, in which a mask is displaced along a scan direction during an exposure of a photosensitive layer. The illumination system has a pupil plane and a field plane. The illumination system includes a transmission filter that has a different transmittance at least at two positions. The transmission filter is arranged between the pupil plane and the field plane.

Because the transmission filter is not arranged in a pupil plane, the effect of the transmission filter is no longer the same for all field points, and the effect of arranging the transmission filter outside a field plane is that the transmission filter modifies the illumination angle distribution and not only the intensity at a field point.

In a scanning projection exposure apparatus, the field illuminated on the mask often has the shape of a slit which, for example, may be rectangular or have the shape of a ring segment. The illuminated field may also be off-axial so that the optical axis of the illumination system does not extend through the middle of the illuminated field, or even extends outside it. Corresponding to this shape of the illuminated field in the mask plane, a light field which has shorter dimensions parallel to the scan direction than perpendicularly thereto, can be illuminated on the transmission filter during the exposure.

In some embodiments, to have a sufficient effect on the illumination angle distribution on the one hand and to be able to achieve the desired field dependency of this effect on the other hand, the transmission filter is desirably at a distance from the pupil plane and the field plane such that a bundle of light rays, all of which pass through a point in the field plane, crosses the transmission filter with a maximum diameter which is less than $L_x/2$ and greater than $L_y/30$, where $L_x$ is the length of the light field perpendicularly to the scan direction and $L_y$ is the length of the light field along the scan direction.

In certain embodiments, an enhanced effect is achieved when the maximum diameter of the bundle is less than $L_x/4$ and greater than $L_y/15$. In some embodiments, a maximum diameter of the bundle which is less than $L_x/8$ and greater than $L_y/7$ has been found to be optimal.

The size of the light field which is illuminated on the transmission filter depends not only on the geometry of the illuminated field, but also on the adjusted illumination setting. When there is a change in the illumination setting, therefore, the size of the light field illuminated on the transmission filter is modified and consequently so is the effect of the transmission filter on the illumination angle distribution. In some embodiments, to permit adaptation to different illumination settings, for example, a manipulator may be provided for continuously varying the position of the transmission filter along the optical axis. In this way, the size of the illuminated light field can be modified straightforwardly by displacing the transmission filter along the optical axis.

Stepwise adaptation is achievable with a relatively simple mechanism if the illumination system includes at least two exchange holders for holding the transmission filter, which are arranged at different positions along the optical axis. The adaptation is then carried out by transferring the transmission filter from one exchange holder to the other.

In certain embodiments, the transmission filter has at least one first filter region which has a transmittance that varies perpendicularly to the scan direction. Only with a transmittance varying in this way the desired field dependency of the effect on the illumination angle distribution can be achieved. This is because, due to the integration of the light energy during the scan process, although variations of the transmittance parallel to the scan direction have an effect on the illumination angle distribution at a specific time, they have virtually no effect on the "integrated" pupil ellipticity.

The light field may have two mutually opposite first edges which delimit the light field along the scan direction, and two mutually opposite second edges which delimit the light field perpendicularly to the scan direction. The first filter region extends at least as far as one of the first edges in this configuration. An asymmetrisation is achieved in this way, since only some of the light rays which arrive on a particular field point throughout the exposure process will pass through such a first filter region. Such an asymmetrisation is desirable so that a pupil ellipticity can be corrected.

In general, the pupil ellipticity varies continuously perpendicularly to the scan direction. Accordingly, for optimal correction, the transmittance of the first filter region desirably also vary continuously perpendicularly to the scan direction.

Usually, the field dependency of the pupil ellipticity is mirror-symmetric with respect to a symmetry plane which extends parallel to the scan direction and contains an optical axis of the illumination system. For optimal correction, it is therefore expedient for the transmittance in the first filter region likewise to have a spatial distribution which is mirror-symmetric with respect to this symmetry plane.

It has furthermore been found that the pupil ellipticity usually increases parabolically, or with a higher exponent, as the distance from the second edges decreases. A transmission filter suitable for the correction then contains a first filter region, the transmittance of which decreases continuously as the distance to the second edges decreases.

If the telecentric properties need no correction, then the transmission filter desirably includes two first filter regions, each of which has a transmittance that varies perpendicularly to the scan direction. It is furthermore desirable in this case for the spatial distributions of the transmittance of both first filter regions to be identical.

The two first filter regions may, for example, be designed as sub-elements which are displaceable along the scan direction. In this way, the corrective effect can readily be modified by displacing the sub-elements along the scan direction. With this approach, for example, adaptation to different illumination settings is possible in a very straightforward way.

The field-dependent attenuation of light rays with the aid of the first filter region entails a field-dependent variation of the overall radiation dose. Since this effect is generally undesirable, corresponding countermeasures desirably are implemented. One possibility for this involves using devices known per se in order to homogenise the radiation dose. The use of field diaphragms may for example be envisaged, the diaphragm elements of which include a multiplicity of individual finger-like diaphragm elements displaceable independently of one another. Alternatively or in addition to this, a grey filter which is arranged in or in the immediate vicinity of an intermediate field plane may be used in order to homogenise the radiation dose.

The transmission filter itself may nevertheless also ensure a corresponding correction of the overall radiation dose if a second filter region is provided, which has a spatial distribution of the transmittance perpendicularly to the scan direction that is qualitatively opposite to the spatial distribution of the transmittance of the first filter region. This means that wherever the transmittance increases perpendicularly to the scan direction in the first filter region, the transmittance of the second filter region decreases along the same direction, and vice verse. In this way, the second filter region constitutes a compensation for the absorptive effect of the first filter region. So that the second filter region does not contribute to the asymmetrisation, it desirably does not adjoin the first edges of the light field.

In some embodiments, the disclosure provides a microlithographic projection exposure apparatus that has a plurality of pupil planes and a plurality of field planes. The microlithographic projection exposure apparatus also includes two transmission filters. The filters have spatial transmittance distributions that are either identical or differ only by a scaling factor. This means that one filter may be considered as a minified or magnified image of the other filter. The scaling factor is determined by the difference of the diameter of a light bundle when it passes through the filters. Such a scaling helps to ensure that the same conditions prevail for both light bundles even if their diameters on the filters are different.

Optionally, the filters are either separated from each other by n pupil planes and n+1 or n−1 field planes, wherein n is an odd integer, or by m field planes and m+1 or m−1 pupil planes, wherein m is an even integer distinct from zero.

These separation conditions can ensure that the light bundles are "internally" inverted. Thus a light ray that passes through a certain point of the first filter passes through a different point on the second filter. If the filters are separated from each other by n pupil planes and n+1 or n−1 field planes, these two points will be arranged on opposite locations on the filters. In this case the spatial transmittance distributions desirably are mirror-symmetric with respect to a symmetry axis.

As a result of this inversion, a symmetrization of the overall effect generated by the two transmission filters can be achieved, which can leave the telecentric properties of the illumination system unaffected, but nevertheless can modify the ellipticity in a field-dependent manner. The uniformity of the irradiance in the mask plane will usually be affected. Thus, it may be desirable to take additional measures, for example an additional filter element arranged in a field plane, that account for the modification of the irradiance distribution introduced by the two transmission filters.

BRIEF DESCRIPTION OF THE DRAWINGS

Other features and advantages will be found in the description, figures and claims, in which:

FIG. 3 is a perspective representation of a plurality of light bundles emerging from a pupil plane;

FIG. 6 is a plan view of a transmission filter;

FIGS. 7a to 7c are plan views of the transmission filter shown in FIG. 6 at various times during a scan process;

FIG. 10 is a plan view of a field diaphragm with a plurality of adjustable diaphragm elements;

FIG. 11 is a plan view of a transmission filter;

FIG. 12 is a plan view of a transmission filter;

DETAILED DESCRIPTION

Figure 1:
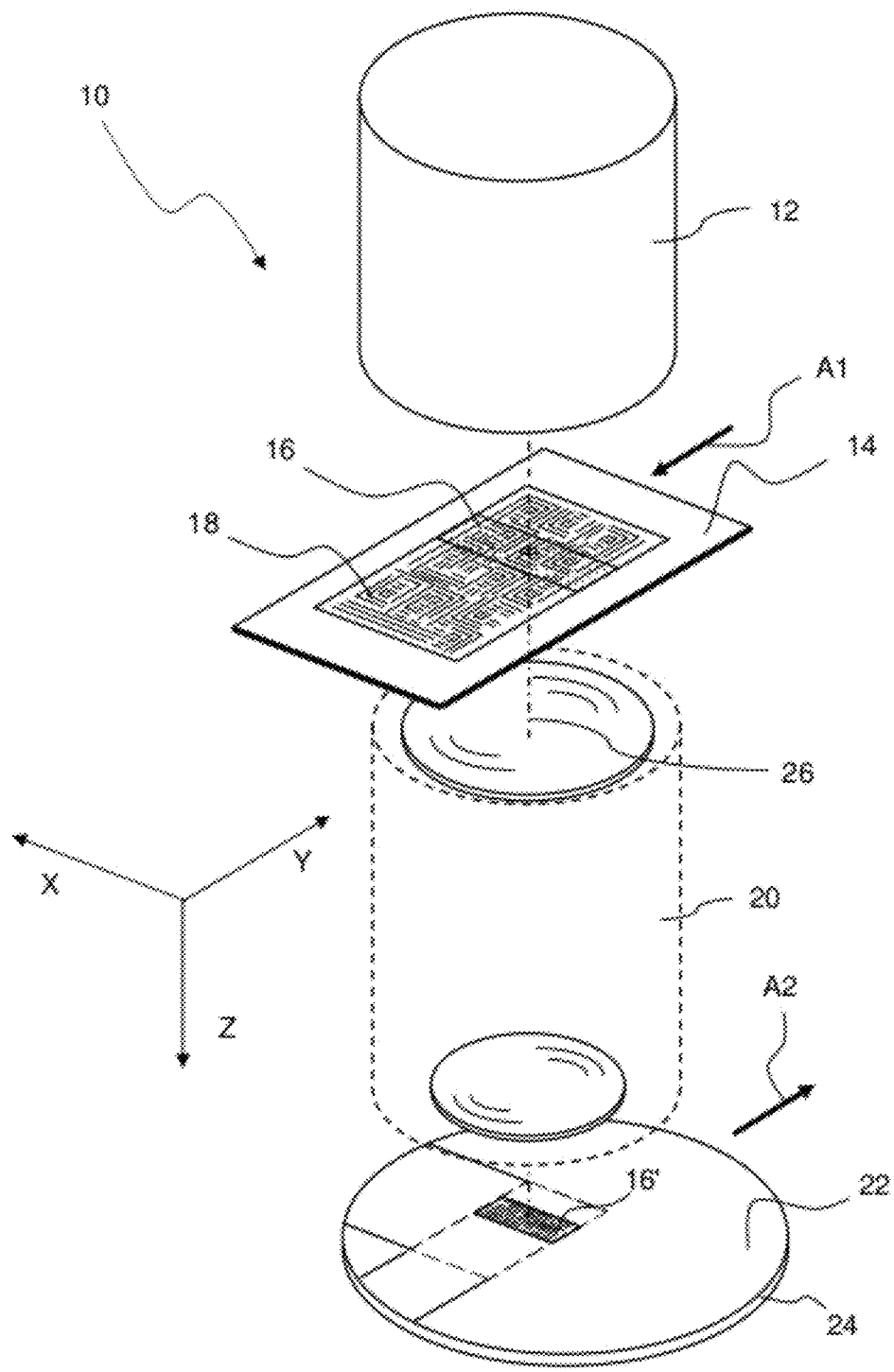
FIG. 1 is a highly simplified perspective representation of a microlithographic projection exposure apparatus.

FIG. 1 is a highly schematised perspective representation of a projection exposure apparatus 10, which is suitable for the lithographic production of microstructured components. The projection exposure apparatus 10 contains an illumination system 12 that illuminates a narrow illuminated field 16, which exemplarily shown as rectangular, on a mask 14. Other illuminated field shapes, for example ring segments, may of course likewise be envisaged.

Structures 18 lying inside the illuminated field 16 on the mask 14 are imaged with the aid of a projection objective 20 onto a photosensitive layer 22. The photosensitive layer 22, which may for example be a photoresist, is applied on wafer 24 or another suitable substrate and lies in the image plane of the projection objective. Since the projection objective 20 generally has an imaging scale β<1, structures 18 lying inside the illuminated field 16 are imaged in a reduced fashion as region 16'.

In the projection exposure apparatus 10 represented, the mask 14 and the wafer 24 are displaced along a direction denoted by Y during the projection. The ratio of the displacement rates is equal to the imaging scale β of the projection objective 20. If the projection objective 20 generates inversion of the image, then the displacement movements of the mask 14 and the wafer 22 will be in opposite directions as is indicated by arrows A1 and A2 in FIG. 1. In this way, the illuminated field 16 is guided in a scanning movement over the mask 14 so that even sizeable structured regions can be projected coherently onto the photosensitive layer 22.

1. First Group of Exemplary Embodiments

Figure 2:
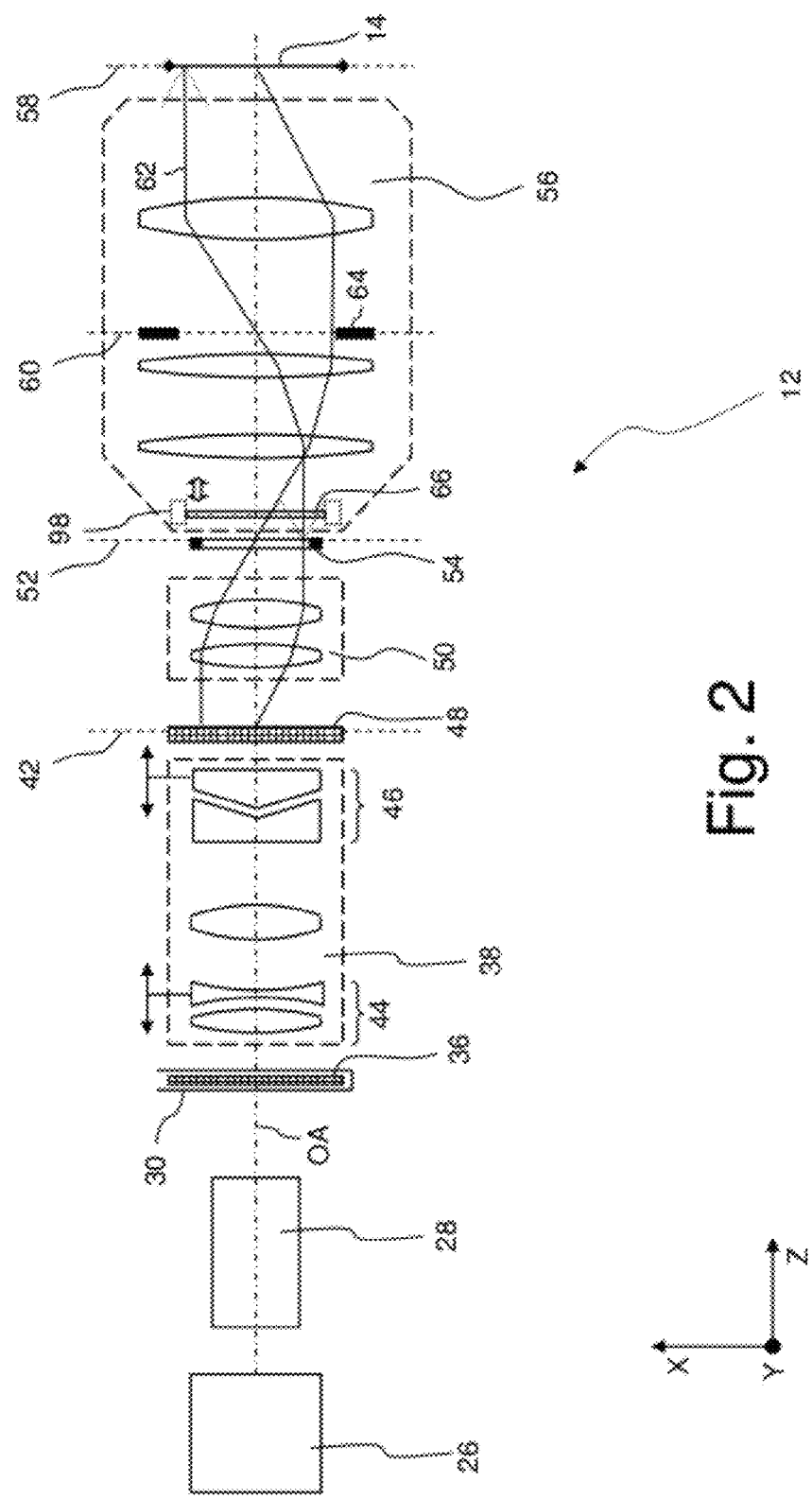
FIG. 2 is a meridional section through an illumination system of the projection exposure apparatus shown in FIG. 1.

FIG. 2 shows details of the illumination system 12 according to a first group of exemplary embodiments in a simplified meridional section which is not true to scale. The illumination system 12 contains a light source 26, which generates projection light. In this group of exemplary embodiments the light source 26 is an excimer laser with which light in the (deep) ultraviolet spectral range can be generated. The use of short-wave projection light is advantageous because a high resolution can thereby be achieved for the optical imaging. Excimer lasers with the laser media KrF, ArF or $F_2$, by which light with the wavelengths 248 nm, 193 nm and 157 nm can respectively be generated, are conventional.

The light generated by the excimer laser used as a light source 26 is highly collimated and diverges only weakly. It is therefore initially expanded in a beam expander 28. The beam expander 28 may for example be an adjustable mirror arrangement, which increases the dimensions of the approximately rectangular light beam cross section.

The expanded light beam subsequently passes through a diffractive optical element 36, held in an exchange holder 30, and a zoom-axicon module 38, which together illuminate a first pupil plane 42 of the illumination system. The zoom-axicon module 38 includes a zoom objective denoted by 44 and an axicon group 46, which contains two axicon elements with conical and mutually complementary faces. With the aid of the axicon group 46, the radial light distribution can be modified so as to achieve annular illumination of the first pupil plane 42. By adjusting the zoom objective 44, it is possible to modify the diameter of the regions illuminated in the first pupil plane 42. The zoom-axicon module 38 therefore makes it possible to adjust various conventional and annular illumination settings.

In order to adjust dipole illuminations and other unconventional illumination settings, in the illumination system represented, a suitable diffractive optical element 36 is inserted into the exchange holder 30. The angle distribution generated by the diffractive optical element 36 is selected so that the desired arrangement of poles is illuminated in the first pupil plane 42.

An optical integrator 48, which may for example be an arrangement of microlens arrays, is arranged in or in the immediate vicinity of the first pupil plane 42. Each microlens constitutes a secondary light source, which generates a divergent light bundles with an angle spectrum predetermined by the geometry of the microlens. The light bundles generated by the secondary light sources are superimposed by a condenser 50 in an intermediate field plane 52, so that the latter is illuminated very homogeneously. The condenser 50 establishes a Fourier relation between the first pupil plane 42 and the intermediate field plane 52. All light rays emerging at the same angle from the first pupil plane 42 therefore arrive at the same point in the intermediate field plane 52, whereas all light rays emerging from a particular point in the first pupil plane 42 pass through the intermediate field plane 52 at the same angle.

In this group of exemplary embodiments a field diaphragm 54, which may for example include a plurality of adjustable blades and/or a multiplicity of narrow finger-like diaphragm elements which can be inserted independently of one another into the light path, is arranged in the intermediate field plane 52. With the aid of a field diaphragm objective 56, the intermediate field plane 52 is optically conjugated with a mask plane 58 in which the mask 14 is arranged. The mask plane 58 is both the image plane of the field diaphragm objective 56 and the object plane of the subsequent projection objective 20.

The field diaphragm objective 56 is schematically indicated with only three lenses in FIG. 2. High-quality field diaphragm objectives, such as are described for example in US 2004/0207928 A1 and WO 2006/114294 A2, generally have more than three lenses. The principal rays, a single one of which is represented by way of example in FIG. 2 and denoted by 62, intersect the optical axis OA in a second pupil plane 60 of the illumination system 12. An aperture diaphragm 64, which restricts the aperture of the field aperture objective 56, is arranged in the second pupil plane 60.

Between the intermediate field plane 52 and the second pupil plane 60, there is a transmission filter 66 whose possible configurations will be discussed below. The purpose of the transmission filter 66 is to correct the illumination angle distribution, for example by reducing undesired asymmetries. What this specifically entails will be explained in more detail below with the aid of FIGS. 3 to 5.

FIG. 3 shows, in a perspective schematic representation, the pupil plane 60 of the field diaphragm objective 56 as well as a detail of the mask plane 58. For this representation, it is assumed that quadrupole illumination is generated by the illumination system 12. As already mentioned above, to this end the diffractive optical element 36 may be configured so that four poles in the first pupil plane 42 are illuminated. Since the illumination angle distribution is not changed by the condenser 50 and by the field diaphragm 54, four poles are also illuminated in the pupil plane 60 of the field diaphragm objective 56, which are denoted by 68a, 68b, 68c and 68d in FIG. 3. The light bundles, which illuminate the poles 68a to 68d, are denoted respectively by 70a, 70b, 70c and 70d and converge at a field point 72 in the mask plane 58. All the light bundles 70a to 70d therefore contribute to the intensity at the field point 72.

In quadrupole illumination, it is generally desirable for all the light bundles 70a to 70d to contribute in the same way to the intensity at the field point 72. Only this will ensure that strip-like structures in the mask 14, which have equal widths but different orientations (vertical or horizontal), are also imaged with equal widths onto the photosensitive layer 22. If the contributions of the light bundles 70a and 70c are greater or less than the contributions of the light bundles 70b and 70d, then for example the situation may arise that horizontally oriented structures are projected onto the photosensitive layer 22 with a greater width than vertically oriented structures, even though in both cases the structures have equal widths in the mask 14.

Figure 4:
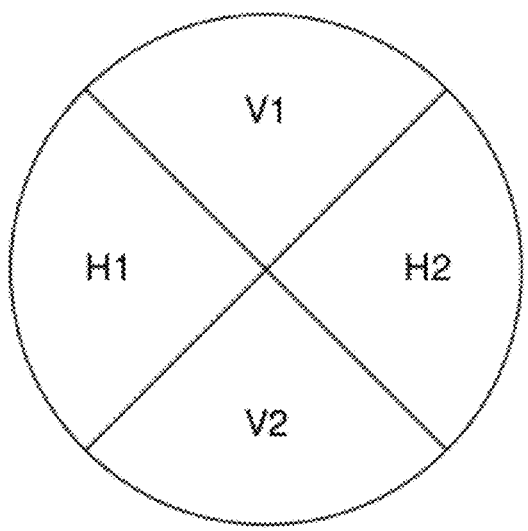
FIG. 4 shows four segments to explain the term pupil ellipticity.

In order to be able to describe this symmetry property of the illumination angle distribution better, the term pupil ellipticity is often employed. In order to determine the pupil ellipticity of all rays which converge at the field point 72 in the mask plane 58, the local pupil assigned to the relevant field point is considered. In this case the local pupil is subdivided into four segments, as shown in FIG. 4. The two segments lying vertically above one another are denoted by V1 and V2, and the segments lying horizontally next to one another are denoted by H1 and H2. This type of description is furthermore illustrated in FIG. 3, in which the individual segments V1, V2, H1 and H2 are separated from one another by dashed lines.

The values $D_{V1}$, $D_{V2}$, $D_{H1}$ and $D_{H2}$ of the integrated radiation dose in the individual segments of the local pupil are then determined. The radiation dose is the radiation energy arriving at the field point throughout the exposure process. In photometry, this quantity is generally referred to not as a radiation dose but as irradiation. The unit of the radiation dose is Joule per square millimeter (J/mm²). The integration of the radiation dose in the segments of the local pupil may be carried out by means of simulation, or alternatively by measurement techniques.

The pupil ellipticity E is then defined as the ratio $$E=(D_{V1}+D_{V2})/(D_{H1}+D_{H2}) \qquad \text{Eq. (1)}$$

The deviation of the value of the pupil ellipticity E from 1 is a measure of how greatly the intensities of the pairwise opposite light bundles 70a, 70c on the one hand, and 70b, 70d on the other hand, differ from one another. The greater the deviation is from one, the more it is to be expected that equally wide horizontally and vertically oriented structures on the mask will be imaged with different widths onto the photosensitive layer 22.

There are a wide variety of causes of pupil ellipticity. One cause may for example be that the diffractive optical element 30 has different diffraction efficiencies for diffraction in horizontal and vertical directions.

The light bundles, which are assigned to individual field points in the mask plane 58, generally travel different paths through the optical element of the illumination system 12. Since the illumination system 12 does not have the same overall transmittance for all paths, the pupil ellipticity E may take different values depending on the field point in question.

In previous illumination systems, however, this field dependency of the pupil ellipticity E could be neglected. If a field-independent pupil ellipticity is assumed, in which case the pupil ellipticity E is essentially equal for all field points 72 on the mask 14, then it is relatively easy to correct the pupil ellipticity i.e. return the pupil ellipticity E to the generally desired value E=1. It may be merely desirable for a transmission filter, which has a transmittance varying spatially in a suitable way, to be arranged in the pupil plane.

However, substantially more stringent desired properties with respect to the pupil ellipticity may be demanded of future illumination systems. In particular, the field dependency of the pupil ellipticity can no longer be neglected.

Figure 5:
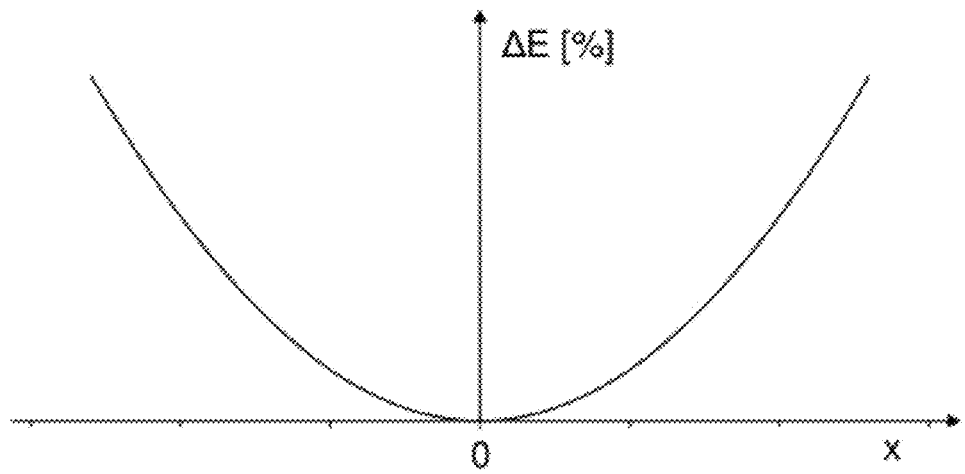
FIG. 5 is a graph in which the percentage deviation of the pupil ellipticity ΔE from the value 1 is plotted as a function of the x coordinate.

A typical field dependency of the pupil ellipticity will be explained with the aid of FIG. 5. FIG. 5 is a graph in which the percentage deviation ΔE of the pupil ellipticity E from the value 1 is plotted by way of example, and merely qualitatively, as a function of the distance x from the field centre along the X direction i.e. perpendicularly to the scan direction Y. The deviation ΔE has an at least approximately parabolic profile and therefore increases significantly towards the lateral edges of the illuminated field 16. Since the illuminated field 16 has substantially shorter dimensions along the scan direction Y than perpendicularly thereto, the pupil ellipticity changes only insubstantially along the scan direction.

One consequence of the field dependency of the pupil ellipticity is that a point on the mask is exposed to different pupil ellipticities during the scan process. Since it is not the pupil ellipticity at a particular field point, but at the mask points which is crucial for the optical imaging by the projection objective 20, the pupil ellipticity desirably is referenced to the individual mask points. This simply means that the radiation dose is integrated not for a fixed field point but for a mask point during the scan process. Since a mask point moves through the illuminated field 16 during the scan process, it will to a certain extent be exposed to the pupil ellipticities of all field points which the mask point moves over during the scan process. Consequently, it is therefore predominantly mask points and not field points which are important in connection with the pupil ellipticity.

A first exemplary embodiment of a transmission filter 66, with which such a field-dependent pupil ellipticity can be corrected, will be explained below with the aid of FIG. 6 as well as 7a, 7b and 7c.

FIG. 6 shows the transmission filter 66 in a plan view, the various transmissivities being indicated by grey values. The darker an area is, the more strongly light passing through is absorbed, and vice versa. The different grey values may for example be generated by continuously varying blackening, which is applied onto a transparent support. As an alternative to this, in the manner of a digital transmission filter, it is possible to apply a large number of individual opaque points onto a support, the size and/or density of which points varies over the surface. Transmission filters with a spatially varying transmittance are often also referred to as grey filters.

For the sake of simplicity, it will be assumed that the transmission filter 66 essentially has the dimensions of a light field through which projection light passes at the position of the transmission filter 66 as shown in FIG. 2, between the intermediate field plane 52 and the second pupil plane 60. The transmission filter 66 is in any event configured so that it may be larger but not smaller than this light field. The transmission filter 66 may of course also have a circular contour, as is conventional for optical elements and also expedient with a view to mounting in standardised frames.

The transmission filter has upper and lower longitudinal edges 74a and 74b, respectively, which extend parallel to the X direction i.e. perpendicularly to the scan direction Y. The two shorter left- and right-hand side edges are denoted by 76a and 76b in FIG. 6. Strip-shaped upper and lower first filter regions 78a and 78b, which reach at least as far as the upper and lower boundaries of the light field or protrude beyond them, extend along the longitudinal edges 74a, 74b. The transmittance of the first filter regions 78a, 78b depends merely on the X coordinate, but not on the Y coordinate. Furthermore, the distribution of the transmittance of the first filter regions 78a, 78b is mirror-symmetric with respect to a symmetry plane 79. The symmetry plane 79 in this case extends through the centre of the light field and contains the optical axis OA. In the exemplary embodiment shown, the transmittance decreases in the X direction with an increasing distance x from the symmetry plane 79, for example with a dependency $\sim x^4$.

Also mirror-symmetric with respect to the symmetry plane 79 is the distribution of the transmittance of the second filter region 80, which occupies the area between the first filter regions 78a, 78b. The spatial distribution of the transmittance in the second filter region 80 is qualitatively opposite to the spatial distribution of the transmittance of the first filter regions 78a, 78b. The lowest transmittance is therefore achieved in the field centre, whereas it increases continuously to the side edges 76a, 76b.

The function of the transmission filter 66 will be explained in more detail below with the aid of FIGS. 7a to 7c. FIGS. 7a to 7c show the transmission filter 66 at three different times during a scan process. For illustration, the illuminated field 16 is respectively indicated by a dashed line (or a field conjugate therewith in the intermediate field plane 52). A mask point 82, which lies at the left-hand edge of the illuminated field 16 illuminated on the mask 14, will be considered first. FIG. 7a shows the position of the mask point 82 at the time when light initially strikes the mask point 82 during the scan process, which is indicated by the arrow 84. A circle indicates the (maximum) diameter of a light bundle 84, the rays of which converge on the mask point 82 at this time.

Since the pupil filter 66 lies neither in the intermediate field plane 52 nor in the second pupil plane 60, the light bundle 84 passes through only a part of the transmission filter 66. The arrangement of the first filter regions 78a, 78b is in this case adapted to the diameter of the light bundle 84 so that a part of the light bundle 84 passes through the upper first filter region 78a at the time shown in FIG. 7a. Some of the light rays, which strike the mask point 82, are therefore attenuated by the upper first filter region 78a at this time.

The cross section of the light bundle 84 is subdivided into four segments, which are correspondingly denoted by V1, V2 and H1, H2 in FIG. 4. In FIG. 7a, it can be seen that the attenuation by the upper first filter region 78a only affects light rays which pass through the upper vertical segment V1. Owing to this attenuation, the proportions of the light which strike the mask point 82 from the four segments V1, V2, H1, H2 is therefore changed.

During the scan process indicated by the arrow 84, the illuminated field 16 moves over the mask point 82. FIG. 7b shows the constellation at a time when the mask point 82 lies no longer at the upper left corner of the illuminated field 16, but approximately centrally on its left-hand side edge. Since the diameter of the light bundle 84 is less than the distance between the two first filter regions 78a, 78b, no attenuation of the light bundle 84 by one of the two first filter regions 78a, 78b takes place.

After further continuation of the scan process, the mask point 82 finally lies at the bottom left corner of the illuminated field 16. Here, the situation is similar as in the constellation shown in FIG. 7a. Now, however, only some of those light rays which pass through the lower vertical segment V2 are attenuated by the lower first filter region 78b. Light rays which pass through the other segments are not affected by the lower first filter region 78b.

If the overall radiation dose is now considered, which strikes the mask point 82 during the scan process shown in FIGS. 7a to 7c, then the following is found:

At the start (FIG. 7a) and at the end (FIG. 7c) of the exposure of the mask point 82, some of the light rays which pass through the vertical segments V1 and V2 are attenuated by the upper first filter region 78a and the lower first filter region 78b, respectively. Since both first filter regions 78a, 78b have the same distributions of the transmittance along the X direction, the attenuation is identical for the segments V1 and V2. Light rays, which pass through the horizontal segments H1 and H2, are unattenuated by the first filter regions 78a, 78b throughout the scan process. The reduction of the values $D_{v1}$, $D_{v2}$ for the radiation dose means, according to Equation (1), that the pupil ellipticity E at the mask point 82 is reduced.

If the pupil ellipticity at the mask point 82 without the transmission filter 66 has a value E>1, then the pupil ellipticity can be reduced by the transmission filter to such an extent that E≈1. A prerequisite is merely that the transmittance in the first filter regions 78a, 78b is adapted to the corrective desired property.

The corrective effect achieved by the filter 66 is field-dependent, since the attenuation caused by the first filter regions 78a, 78b depends on the position of the mask point 82 in the X direction. In FIGS. 7a to 7c the mask point 82 lies at the outer edge of the illuminated field 16, where according to FIG. 5 the pupil ellipticity is greatest. The smaller the distance from a mask point to the symmetry plane 79 is, the less is the attenuation caused by the first filter regions 78a, 78b and therefore the correction of the pupil ellipticity. If a mask point 86 lies exactly in the symmetry plane 79, as is indicated in FIGS. 7a to 7c at the centre of the illuminated field 16, then the first filter regions 78a, 78b cause virtually no attenuation so that likewise no significant correction of the pupil ellipticity takes place there.

Figure 8:
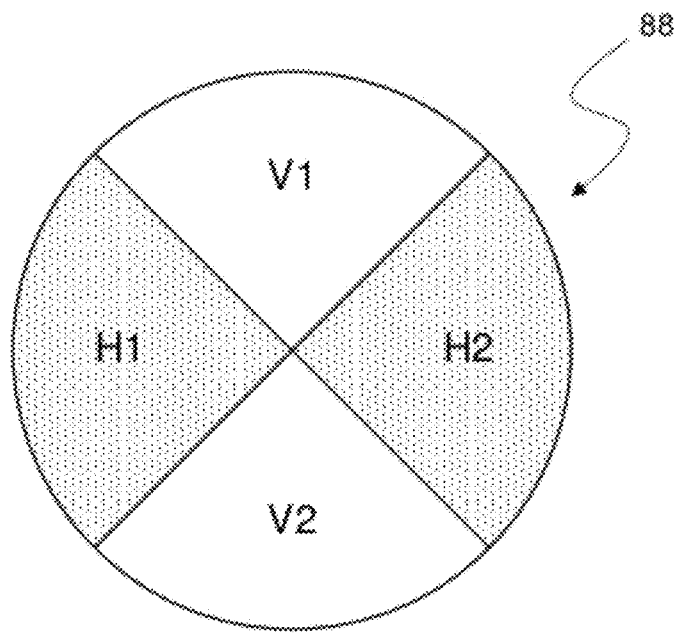
FIG. 8 is a plan view of an additional pupil filter.

In principle, correction of pupil ellipticities E<1 may also be achieved by the filter 66. Since amplification of light rays is not possible, in this case it would in fact be desirable to attenuate only light rays which pass through the horizontal segments H1, H2. Since this cannot be achieved for all mask points during the scan process with only one transmission filter 66, in this case a pupil filter which is schematically shown in a plan view in FIG. 8, and is denoted by 88, may be fitted in a pupil plane of the illumination system 12, for example in the pupil plane 60 of the field diaphragm objective 56. This pupil filter 88 is likewise a transmission filter, but one in which only the two segments H1, H2 have a lower transmittance. Owing to the arrangement of the pupil filter 88 in a pupil plane, the concomitant effect on the pupil ellipticity is equal for all field points and therefore also for all mask points. With a sufficient attenuation in the segments H1, H2, the effect achieved in this way is that the original pupil ellipticity E<1 becomes a pupil ellipticity E>1 for all mask points. This can be corrected in the manner described above by the transmission filter 66.

The reason why an additional second filter region 80 with a position-dependent transmittance is arranged between the first filter regions 78a, 78b will be explained below.

If the mask point 82 at the left-hand edge of the illuminated field 16 is again considered, then—if the second filter region were not present—this would receive a smaller radiation dose throughout the scan process than the mask point 86 in the symmetry plane 72. The reason for this is that for the mask point 86 in the symmetry plane 79, no rays are attenuated to a significant extent by the first filter regions 78a, 78b. Without the second filter region 80, the effect of this different attenuation for different mask points would be that the mask points in the exemplary embodiment shown would overall receive a commensurately smaller radiation dose, the father they are away from the symmetry plane 79. Such an effect is generally undesirable since, owing to the sharp exposure threshold of the photosensitive layer 22, the radiation dose has a crucial influence on the structure widths which are generated on the support 24.

The second filter region 80 is therefore configured precisely so that the overall radiation dose during the scan process is equal for all mask points. At the mask points for which no or only little attenuation by the first filter regions 78a, 78b takes place, the attenuation by the second filter region 80 is greatest. At the edge of the illuminated field 16, where the greatest attenuation by the first filter regions 78a, 78b occurs, the second filter region 80 has its maximum transmittance of close to 100%.

Figure 9:
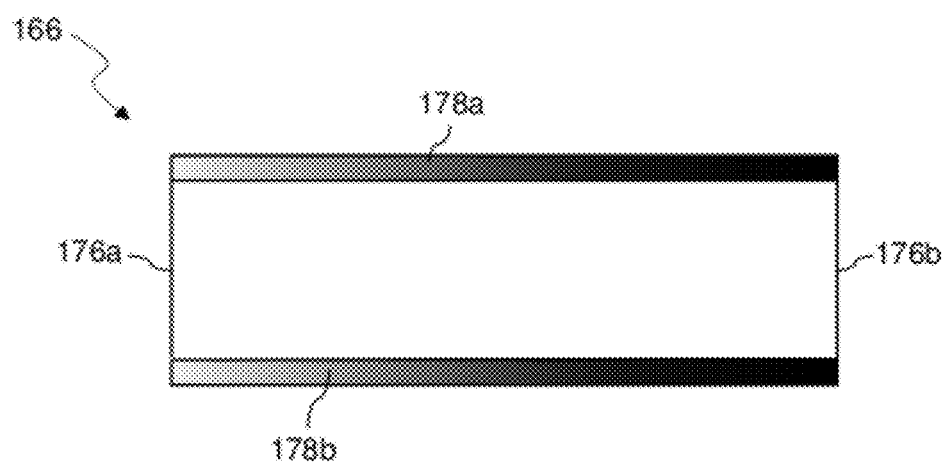
FIG. 9 is a plan view of a transmission filter.

FIG. 9 shows a second exemplary embodiment of a transmission filter, which is likewise suitable for use in the illumination system 12. Parts which are the same or correspond to one another are in this case denoted by reference numerals increased by 100.

In contrast to the transmission filter 66 shown in FIG. 6, the first filter regions 178a, 178b do not have a mirror-symmetric distribution of the transmittance. Rather, in this exemplary embodiment the transmittance increases continuously from the left-hand side edge 176a to the right-hand side edge 176b.

With such a distribution of the transmittance, for example, it is possible to correct a pupil ellipticity which continuously approximates the value 1 along this direction.

Furthermore, the transmission filter 166 does not have a second filter region 80. Rather, the transmittance is maximal between the two first filter regions 178a, 178b. The section between the two first filter regions 178a, 178b may, for example, consist of a transparent homogeneous material or be entirely omitted. In the latter case, the transmission filter 166 therefore consists of two individual sub-elements which form the first filter regions 178a, 178b.

Since a second filter region 80 is not provided in the transmission filter 166, without additional measures it would not be ensured that the radiation dose integrated throughout the scan process is equal at all mask points.

Measures which may be envisaged for this are, for example, the use of a field diaphragm 54 as described for example in EP 0 952 491 A2 or EP 1 020 769 A2. These known field diaphragms include a multiplicity of individual rod- or platelet-shaped diaphragm elements, which are displaceable individually and parallel to the scan direction.

FIG. 10 shows a suitable field diaphragm 154 having an arrangement of diaphragm elements 90 in a schematic and highly simplified plan view. The diaphragm elements 90 make it possible to establish the width of the illuminated field 16 individually as a function of the longitudinal coordinate (X). The smaller the distance between mutually opposing diaphragm elements 90 of the field diaphragm 154 is, the less is the radiation dose which can be measured throughout the scan process at a mask point, the x coordinate of which corresponds to the position of the relevant diaphragm element 90.

In order to compensate to a certain extent for the high transmittance of the first filter regions 178a, 178b at the right-hand side edge 176b, mutually opposing diaphragm elements 90 on the right-hand side are spaced more closely together than on the opposite side. Essentially the same effect is thereby achieved as with the second filter region 80 in the exemplary embodiment shown in FIG. 6. Certain differences result from the fact that, owing to the width of the illuminated field 16 varying along the X direction, the positions of the light bundles are also changed relative to the first filter regions 178a, 178b.

From the two exemplary embodiments above, it is clear that the way in which the distribution of the transmittance is established in the first filter regions 178a, 178b depends above all on the dependency of the pupil ellipticity E on the x coordinate. Since the pupil ellipticity is generally a continuous, i.e. piecewise differentiable function of the x coordinate, the distribution of the transmittance in the first filter regions is also desirably continuous. Particularly when there are small pupil ellipticities to be corrected, however, it may be sufficient to provide first filter regions which have a discontinuous distribution of the transmittance.

A simple exemplary embodiment of this is shown in FIG. 11. The transmission filter shown there and denoted overall by 266 includes two first filter regions 278a, 278b, which are arranged at the upper and lower longitudinal edges 274a, 274b. Inside the first filter regions 278a, 278b, there are four filter zones 277a, 277b, 277c and 277d which are arranged mirror-symmetrically with respect to a symmetry plane 279 and inside which the transmittance is respectively constant. With such a transmission filter 266, for example, it is possible to correct wave-shaped pupil ellipticities which are symmetrical with respect to the symmetry plane 279. Although the stepped approximation to the wave-like profile of the pupil ellipticities leads to errors, these can be tolerated at least within certain limits. Undesired effects on the overall radiation dose can here again be avoided with the aid of the adjustable diaphragm elements 90, as shown in FIG. 10, or an additional second filter region is provided as in the transmission filter 66. The advantage of the transmission filter 266 over the exemplary embodiments described above is primarily that there are no regions with continuous profiles of the transmittance. The transmission filter 266 can therefore be produced particularly cost-effectively.

In a representation analogous to FIG. 11, FIG. 12 shows another exemplary embodiment of a transmission filter denoted overall by 336. The transmission filter has first filter regions 378a, 378b, which likewise contain filter zones 377a, 377b with a constant transmittance over the surface. In contrast to the exemplary embodiments described above, however, the filter zones 377a, 377b have an extent in the scan direction (Y) which depends on the x coordinate. In the exemplary embodiment represented, the filter zones 377a, 377b have a step-shaped platform-like shape. In order to be able to correct continuous pupil ellipticities even better, the outer contours of the filter zones 377a, 377b which face one another may of course be continuously curved as indicated on the right-hand half of FIG. 12 by dashed lines 377a', 377b'.

Figure 13:
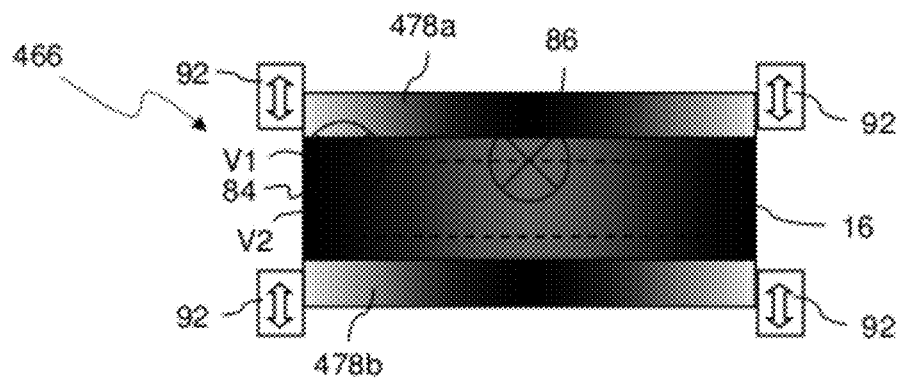
FIG. 13 is a plan view of a transmission filter, in which adjustable first filter regions are provided.

In a representation analogous to FIG. 6, FIG. 13 shows a transmission filter denoted by 466 according to another exemplary embodiment. The transmission filter 466 differs from the transmission filter 66 shown in FIG. 6 in that two first filter regions 478a, 478b are respectively formed by mutually independent sub-elements which are displaceable in the scan direction (Y) with the aid of actuators 92. By displacing the first filter regions 478a, 478b in opposite directions, the distance between the first filter regions 478a, 478b can be increased or reduced symmetrically with respect to the illuminated field 16. In this way, for example, the effect on the pupil ellipticity can respectively be reduced or increased for all mask points.

Figure 14:
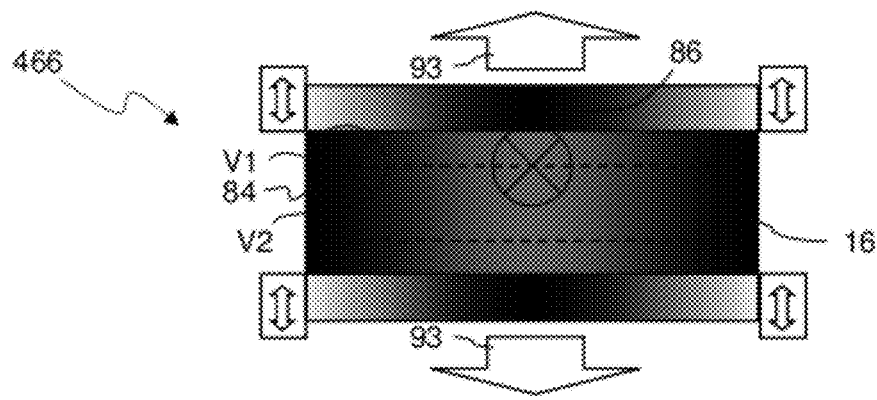
FIG. 14 shows the transmission filter of FIG. 13, in which the first filter regions lie in a different position in order to change the corrective effect.

This is clear when the constellation shown in FIG. 13 is compared with the constellation shown in FIG. 14. The constellation shown in FIG. 14 is derived from the constellation shown in FIG. 13 by displacing the two first filter regions 478a, 478b outwards, i.e. away from one another. This displacement is indicated by arrows 93 in FIG. 13. Owing to the concomitant increase in the distance between the first filter regions 478a, 478b, in the constellation shown in FIG. 14 only a small portion of the light rays which pass through the vertical segments V1 and V2 are now attenuated by the first filter regions 478a and 478b, respectively. The effect on the pupil ellipticity is correspondingly small.

By moving the first filter regions 478a, 478b along the scan direction Y, for example, it is therefore possible to accommodate changes in the pupil ellipticity, such as may occur in the course of the operating time of the illumination system 12, by adjusting the distance between the first filter regions 478a, 478b.

Adjustable first filter regions 478a, 478b may however also be expedient when adaptation to different illumination settings is desirable. This will be explained with the aid of FIG. 15, which shows the transmission filter 466 in a constellation in which the distance between the first filter regions 478a, 478b is reduced relative to the constellation shown in FIG. 13. It is assumed here that a small conventional illumination setting has been selected, for which the maximum diameter of the light bundles 84', 86' at the position of the transmission filter 466 is less than in the constellation shown in FIG. 13. If the first filter regions 478a, 478b were to remain in the position shown in FIG. 13 with such a small diameter of the light bundles 84', 86', then no light rays at all would pass through the first filter regions 478*a*, 478*b*. By displacing the first filter regions 478*a*, 478*b* in the direction indicated by arrows 93', however, light bundles in the segments V1 and V2 are again attenuated in the desired way by the first filter regions 478*a* and 478*b*, respectively.

Instead of moving the first filter regions 478*a*, 478*b* along the scan direction, the entire transmission filter 66 may also be displaced parallel to the optical axis. The diameter of the light bundles passing through the transmission filter 66 is thereby changed, so that the effect of the first filter regions 78*a*, 78*b* is also changed. In order to adjust the transmission filter 66 along the optical axis OA, Z manipulators 98 may be used as indicated by dashes in FIG. 2. If only a few different illumination settings can be adjusted, then it is sufficient to arrange a plurality of exchange holders for receiving the transmission filter 66 along the optical axis OA. Discrete displacement of the transmission filter 66 along the optical axis OA is possible in this way, by transferring the transmission filter 66 from one exchange holder into another exchange holder.

In the exemplary embodiments described so far, the transmission filter always has two first filter regions which can be delimited discontinuously from a second region (optionally, one which continuously is maximally transmissive) arranged between them. Nevertheless, the desired effect on the pupil ellipticity may also be achieved with transmission filters which have a continuous distribution of the transmittance over their entire surface.

Figure 16:
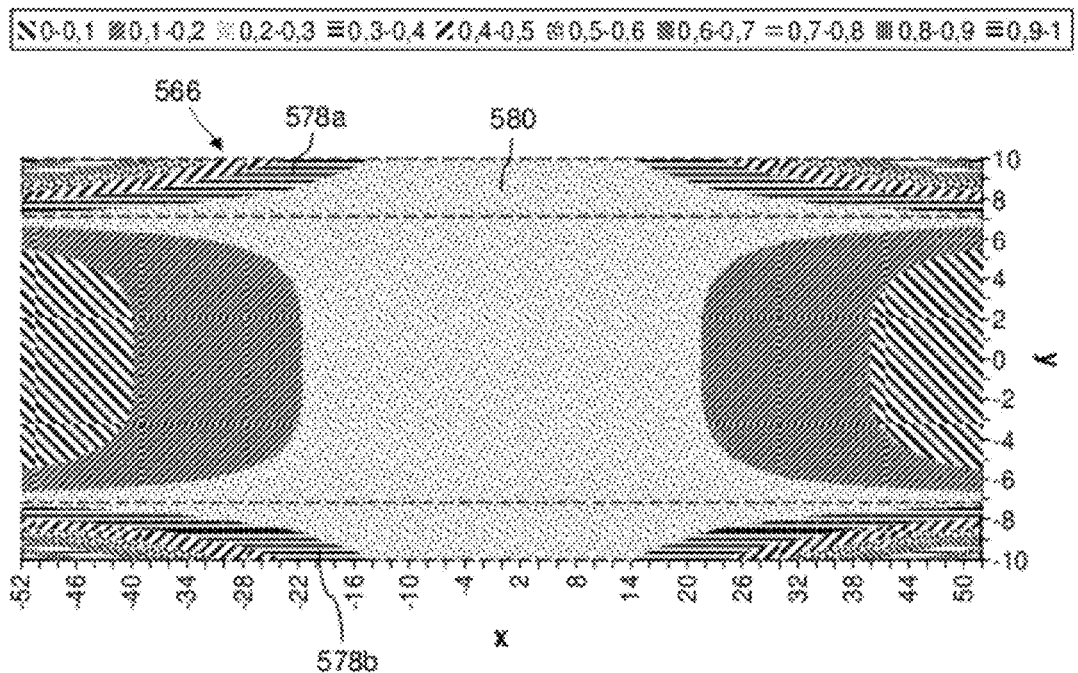
FIG. 16 is a plan view of a transmission filter.

The diagram shown in FIG. 16 shows the distribution of the absorption coefficient A of such a transmission filter 566. With negligible reflection, the absorption coefficient A is obtained from the transmittance T by A=1−T. For reasons of representation, those surfaces of the transmission filter 566 whose absorption coefficients lie within the ranges indicated in the legend are graphically separated from one another. In fact, however, the distribution of the absorption coefficient over the entire surface of the transmission filter 566 is continuous.

Figure 17:
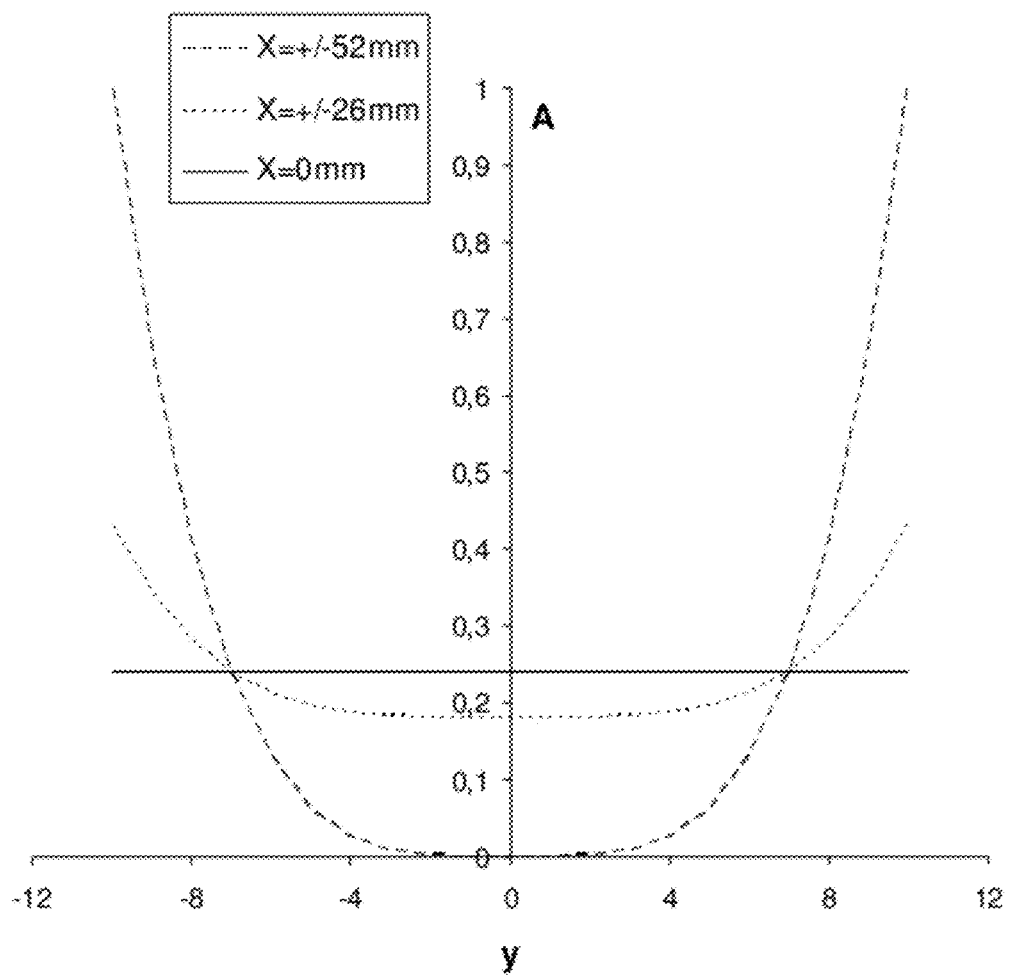
FIG. 17 is a graph in which the absorption coefficient is plotted as a function of the y coordinate for three different x coordinates for the transmission filter shown in FIG. 16.
Figure 18:
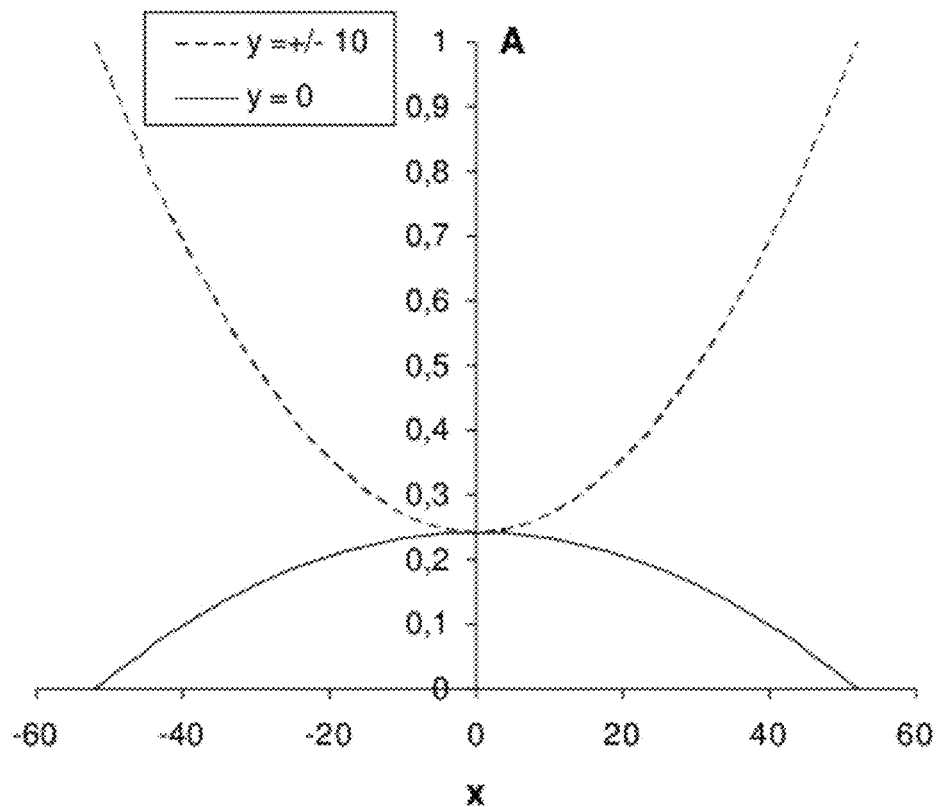
FIG. 18 is a graph in which the absorption coefficient is plotted as a function of the x coordinate for two different y coordinates for the transmission filter shown in FIG. 16.

This is clear from FIGS. 17 and 18, in which the absorption coefficient A in arbitrary units is plotted for three different x coordinates as a function of the y coordinate, and for two different y coordinates as a function of the x coordinate, respectively. From FIGS. 16 to 18, it is clear that the distribution of the absorption coefficient over the surface of the transmission filter 566 is similar in principle as for the transmission filter 66 which is shown in FIG. 6. Thus, at the upper and lower edges as seen in the scan direction, there are first filter regions 578*a*, 578*b* which are indicated by the diagram of FIG. 16 using dashed lines. Inside these first filter regions 578*a*, 578*b* the transmittance decreases with an increasing distance from the filter centre, as is shown most clearly in FIG. 18 by the dashed line. In a second filter region 580 however, which lies between the first filter regions 578*a*, 578*b*, the transmittance decreases towards the lateral filter edges.

The crucial difference to the transmission filter 66 in FIG. 6 is revealed most clearly by FIG. 17. There, it is shown that the distribution of the transmittance along the scan direction is always continuous at all x coordinates, whereas in the transmission filter 66 it has discontinuities at the transitions between the first filter regions 78*a*, 78*b* and the second filter region 80.

The distribution of the transmittance T=1−A (with negligible reflection) in the exemplary embodiment represented is obtained from the following Equation (2) for the absorption coefficient A(x,y):

$$A(x,y)=a(x)\cdot y^4+b(x) \quad \text{Eq. (2)}$$

A filter function A(x,y) with a fourth-order polynomial is favourable because such filters can be produced as digital filters by tried and tested production methods.

The function a(x) is established so that the pupil ellipticity E is corrected optimally. This function a(x) is desirably determined numerically, and it depends on the precise position of the transmission filter in the illumination system 12.

The function b(x) is established so that, for a predetermined function a(x), Equation (3) is satisfied:

$$\int A(x,y)dy=\text{const} \quad \text{Eq. (3)}$$

The function b(x) therefore ensures that the overall radiation dose during the scan process remains equal at each mask point.

In general, illumination systems are set up so that they are telecentric on the mask side. This means that the centroid rays travel parallel to the optical axis OA in the mask plane 58. If an attenuation were to take place in only one of the segments, then this would entail tilting of the centroid rays so that the illumination system 12 would no longer be telecentric.

This applies correspondingly for illumination systems which are not telecentric. Even in this case, it is generally undesirable for the non-telecentric direction distribution of the centroid rays to be perturbed by one or more transmission filters.

On the other hand, situations may also be envisaged in which the actual direction distribution of the centroid rays does not coincide with the (for example telecentric) direction distribution desired per se. In these cases, the transmission filters described above may be used in order to correct the telecentric properties of the illumination system.

In the transmission filters shown in FIGS. 6, 9, 11 and 12, for example, a different effect would be obtained for the vertical segments V1 and V2 if the two first filter regions do not have the same distribution, but different distributions of the transmittance. Optionally, one of the two first filter regions could even be entirely omitted.

Figure 15:
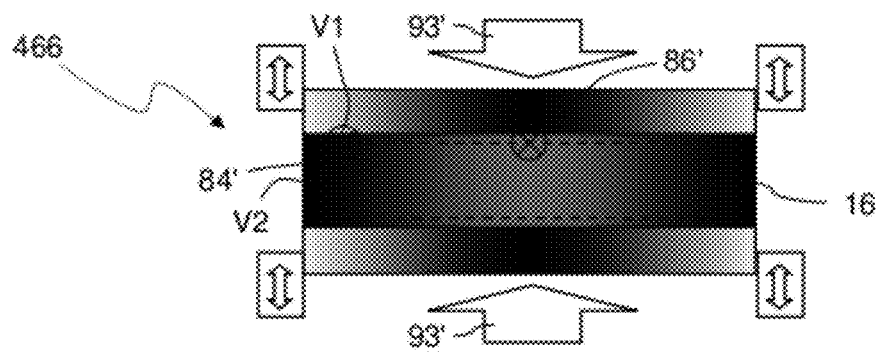
FIG. 15 shows the transmission filter of FIG. 13, in which the first filter regions lie in a different position in order to adapt to a different illumination setting.

In the transmission filter shown in FIGS. 13 to 15, an asymmetrisation may be achieved by moving the first filter regions 478*a*, 478*b* differently along the scan direction, so that an asymmetric arrangement is obtained with respect to the illuminated field 16.

From the considerations above, it is clear that with the aid of the transmission filters, which are arranged between a field plane and a pupil plane, not only can pupil ellipticities be improved without changing the telecentric properties, but at the same time telecentric properties may also be deliberately corrected.

2. Second Group of Exemplary Embodiments

Figure 19:
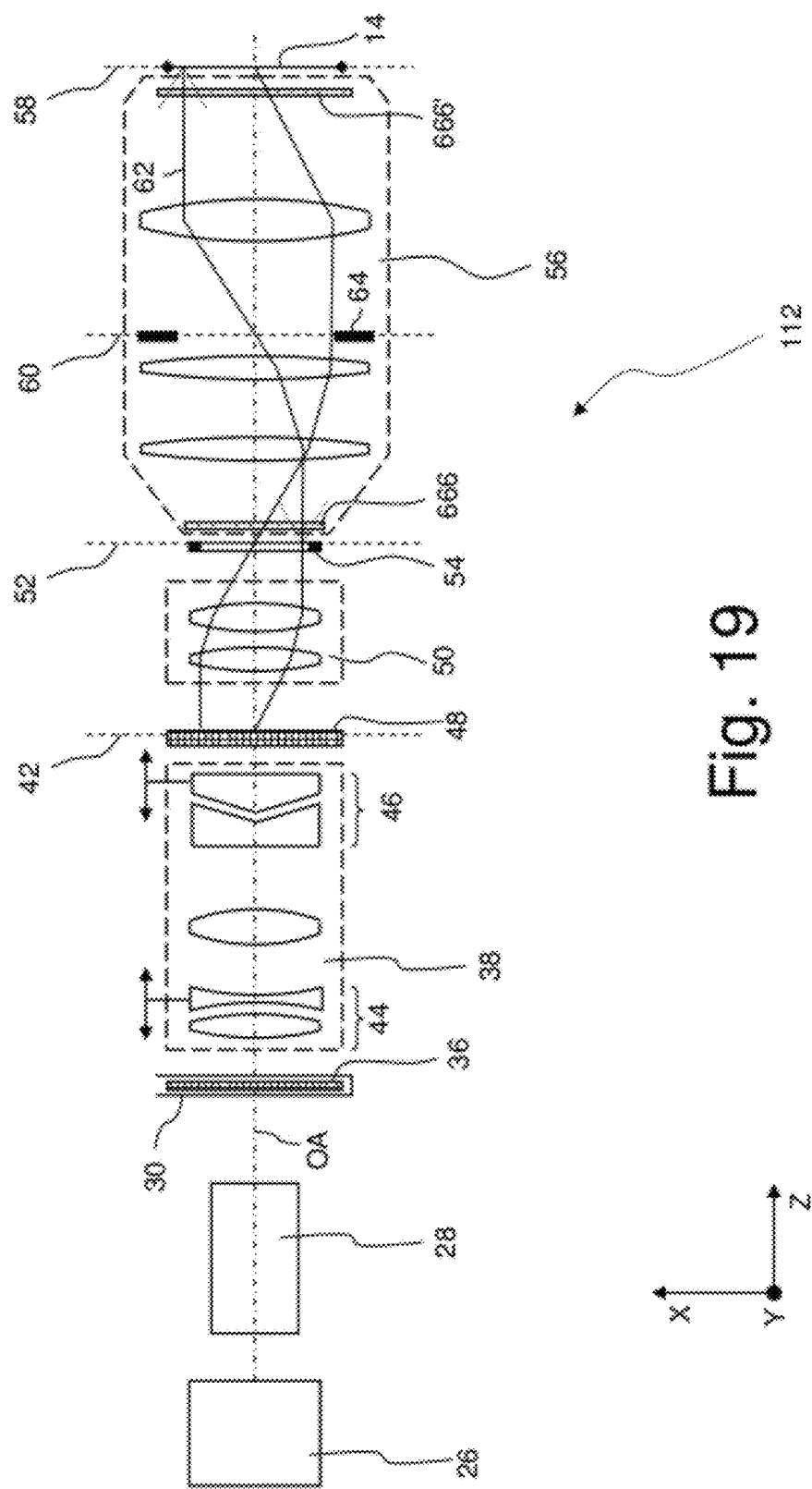
FIG. 19 is a meridional section through an illumination system of the projection exposure apparatus shown in FIG. 1.

FIG. 19 is a meridional section through an illumination system, which is denoted in its entirety by 112, according to another exemplary embodiment. Since the illumination system 112 is similarly constructed as the illumination system 12 shown in FIG. 2, parts corresponding to one another are provided with the same reference numerals.

The illumination system 112 differs from the illumination system 12 shown in FIG. 2 mainly in that not just one but two transmission filters are arranged in the field diaphragm objective 56 in planes optically conjugate with one another.

The second pupil plane 60 lies between the first transmission filter 666 and the second transmission filter 666'. The image resulting on the mask 14 is therefore point-symmetric with the original image in the intermediate field plane 52, i.e. right and left as well as up and down interchanged. This can be seen for example from the principal ray denoted by 62, which comes from the intermediate field plane 52 in FIG. 19 and initially travels below the optical axis OA. After passing through the second pupil plane 60, the principal ray 62 travels above the optical axis OA. The bundle of rays associated with the principal ray 62 is therefore inverted when it strikes the mask 14.

Figure 20:
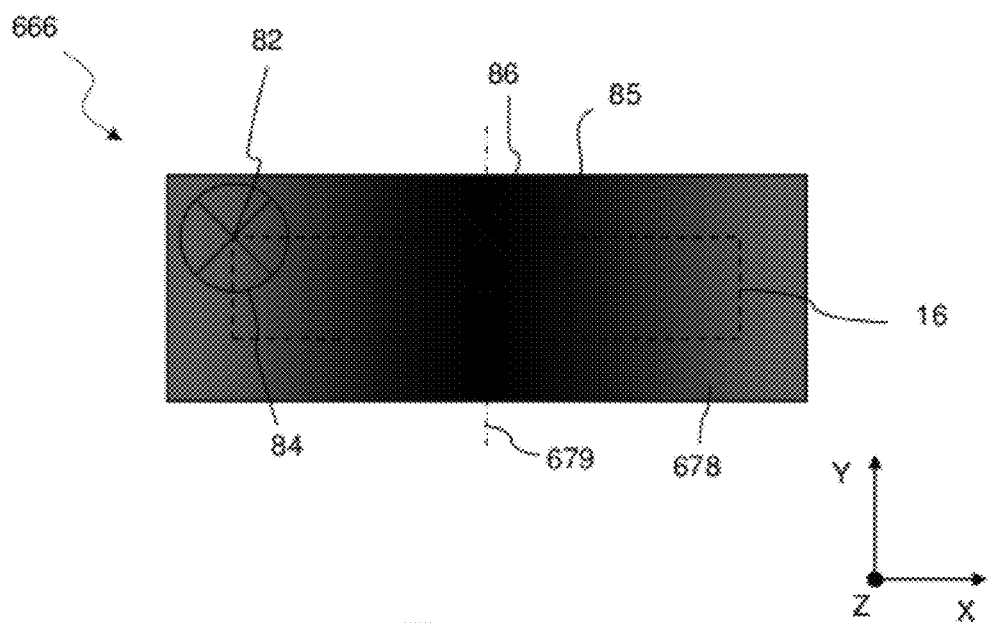
FIG. 20 is a plan view of a first transmission filter for the illumination system shown in FIG. 19.
Figure 22:
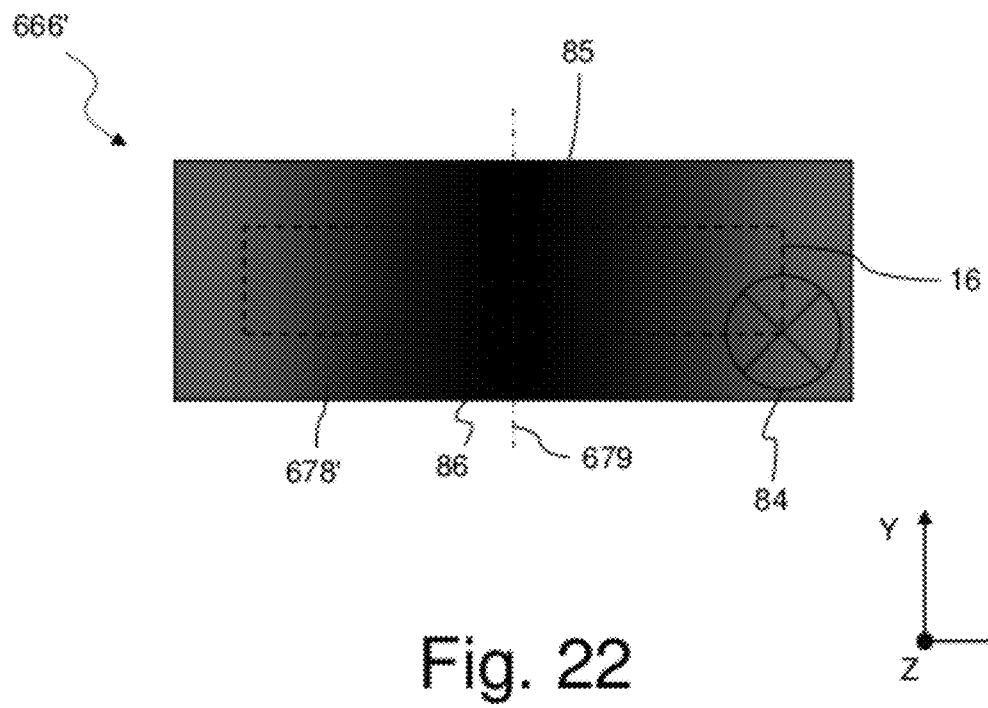
FIG. 22 is a plan view of a second transmission filter for the illumination system shown in FIG. 19.

The first and second transmission filters 666 and 666' shown in FIGS. 20 and 22 have only a first filter region, which is denoted respectively by 678 and 678'. The first filter regions 678, 678' in the exemplary embodiment represented have the same nonlinear distribution of the transmittance as the first filter regions 78a, 78b in the exemplary embodiment shown in FIG. 6. The transmittance therefore does not depend on the y coordinate, and it decreases with an increasing distance from a symmetry plane 679 which contains the optical axis. With such a distribution of the transmittance, it is possible to correct a pupil ellipticity as shown by way of example in FIG. 5.

In order to explain the functionality of the two transmission filters 666, 666', reference will be made to FIGS. 20 and 22. In a representation corresponding to FIG. 7a, FIG. 20 shows light bundles 84, 85 which converge respectively at mask points 82 and 86 in the mask plane 85. The constellation is in each case represented at the time when the illumination of the mask points 82 and 86 during the scan process begins.

As can be established by comparing FIGS. 20 and 22, the light bundles 84, 85 pass through different positions on the transmission filters 666 and 666' at the same time. If the mask point 82 lying at the outer side edge of the illuminated field 16 is considered first, then the light bundle 84 which converges on the mask point 82 passes through the first transmission filter 666 in the upper left corner of the light field illuminated there, and it passes through the second transmission filter 666' in the bottom right corner of the light field illuminated there. This is a consequence of the aforementioned inversion at the second pupil plane 60.

Figure 21:
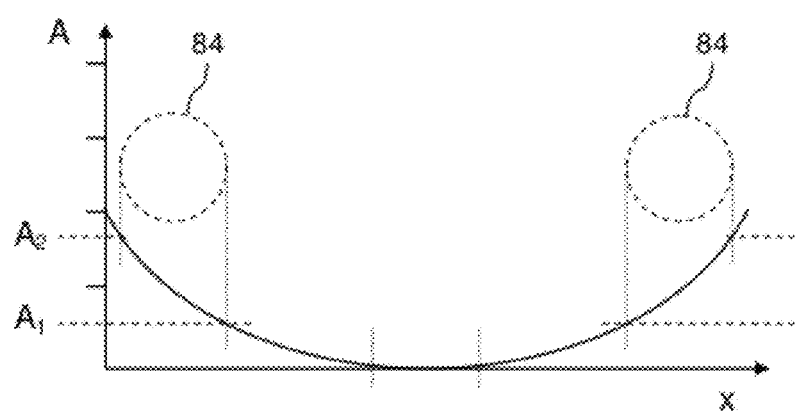
FIG. 21 is a graph in which the dependency of the absorption on the x coordinate is plotted.

The way in which the various positions, at which the light bundle 84 passes through the two transmission filters 666, 666', has an effect on the pupil ellipticity will be made clear with the aid of the graphs shown in FIGS. 21 and 23. The graph shown in FIG. 21 illustrates the dependency of the absorptivity $A=1-T$ (with negligible reflection) on the x coordinate. When it passes through the first transmission filter 666, the light bundle 84 experiences an absorption with absorption coefficients between $A_2$ and $A_1$, as shown on the left in FIG. 21. When it passes through the second transmission filter 666', the light bundle 84 experiences an absorption with absorption coefficients between $A_1$ and $A_2$ (see the right in FIG. 21).

Since the two transmission filters 666, 666' in the exemplary embodiment represented lie in planes optically conjugate with one another, the diameter of the light bundle 84 in the two filter planes is identical. The overall effect of the two transmission filters 666, 666' is therefore symmetrical for any light bundle which passes through the transmission filters 666, 666'. This is illustrated by the graph shown in FIG. 23, in which the absorption profiles in the two transmission filters 666, 666' are superimposed. The two differently dashed curves therein indicate the absorption which the light bundle experiences when it passes through the first transmission filter 666 and the second transmission filter 666', respectively. Superimposing the two absorption profiles leads to the curve represented by a solid line, which is symmetrical with respect to the line 99 represented by dots and dashes.

Figure 23:
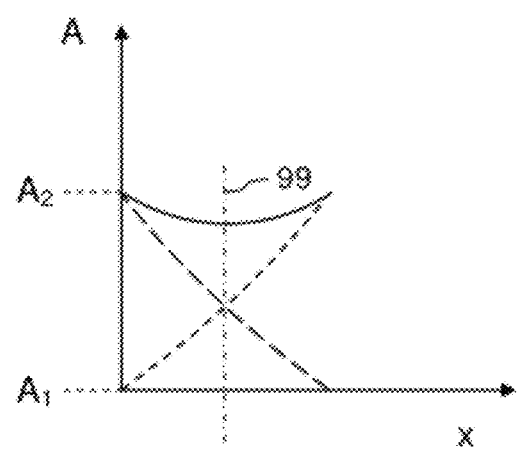
FIG. 23 is a graph in which the dependencies of the absorption on the x coordinate for the two transmission filters are superimposed.

The light bundle 84 will therefore be attenuated by the combination of the two transmission filters 666, 666' in the same way as if it were to pass through a single transmission filter which has the absorption distribution, symmetrical with respect to the line 99, shown by a solid line in FIG. 23. The effect of this absorption distribution, which is symmetrical for any light bundle, is that light rays which pass through the horizontal segments H1, H2 are attenuated more strongly than light rays which pass through the vertical segments V1, V2. The pupil ellipticity is therefore increased according to Eq. (1), so that the pupil ellipticity E can be brought close to the value 1 (optionally by using an additional transmission filter in a pupil plane). Owing to the symmetrical absorption distribution, moreover, the position of the principal ray as an energetically central ray (centroid ray) of the light bundle, and therefore the telecentric properties, are preserved at the same time.

The corrective effect is also field-dependent in this exemplary embodiment, since the transmittance of the first filter regions 678, 678' varies nonlinearly along the X direction. The light bundle 85 assigned to the mask point 86 experiences for example only a minor correction of the pupil ellipticity, since the transmittance is modified only relatively weakly in the vicinity of the symmetry plane 679.

Since the total radiation dose arriving on the mask points is influenced field-dependently by the two transmission filters 666, 666', additional measures desirably are taken in order to preserve the radiation dose. The use of adjustable field diaphragms may for example be envisaged, as explained above in connection with FIG. 10.

In this exemplary embodiment it is assumed that a field-dependent pupil ellipticity is intended to be corrected by the transmission filters, but without changing the position of the centroid ray as an energetically central ray and therefore the telecentric properties. A prerequisite for this is that during attenuation of light rays which lie in the horizontal segments H1, H2 or in the vertical segments V1, V2, the intensity ratio inside the two vertical segments or the two horizontal segments is preserved. If only the intensity of light rays which pass through the vertical segment V1 were to be attenuated, for example, the weighting between light rays which pass through the vertical segment V1 and the vertical segment V2 would be changed. This would entail a displacement of the centroid ray and therefore a change in the telecentric properties of the illumination system 12.

In the exemplary embodiment shown in FIG. 19 the transmission filters 666, 666' have equal transmittance distributions, as can be seen FIGS. 20 to 22. This is possible because the axial positions of the transmission filters 666, 666' are determined such that the diameters of the light bundles 84, 85 are identical on both filters 666, 666'.

However, if such an axial position of the transmission filters 666, 666' is not desired or possible, these diameters will be different. This can be allowed for by providing transmission filters that are identical except a scaling factor. This means that one filter may be considered as a minified or magnified image (possibly inverted, if the filters are separated by n pupil planes and n+1 or n−1 field planes, wherein n is an odd integer). The scaling factor is determined by the difference of the diameter of a light bundle when it passes through the filters. Such a scaling ensures that the same conditions prevail for both light bundles even if their diameters on the filters are different.

Alternative Exemplary Embodiments

Figure 24:
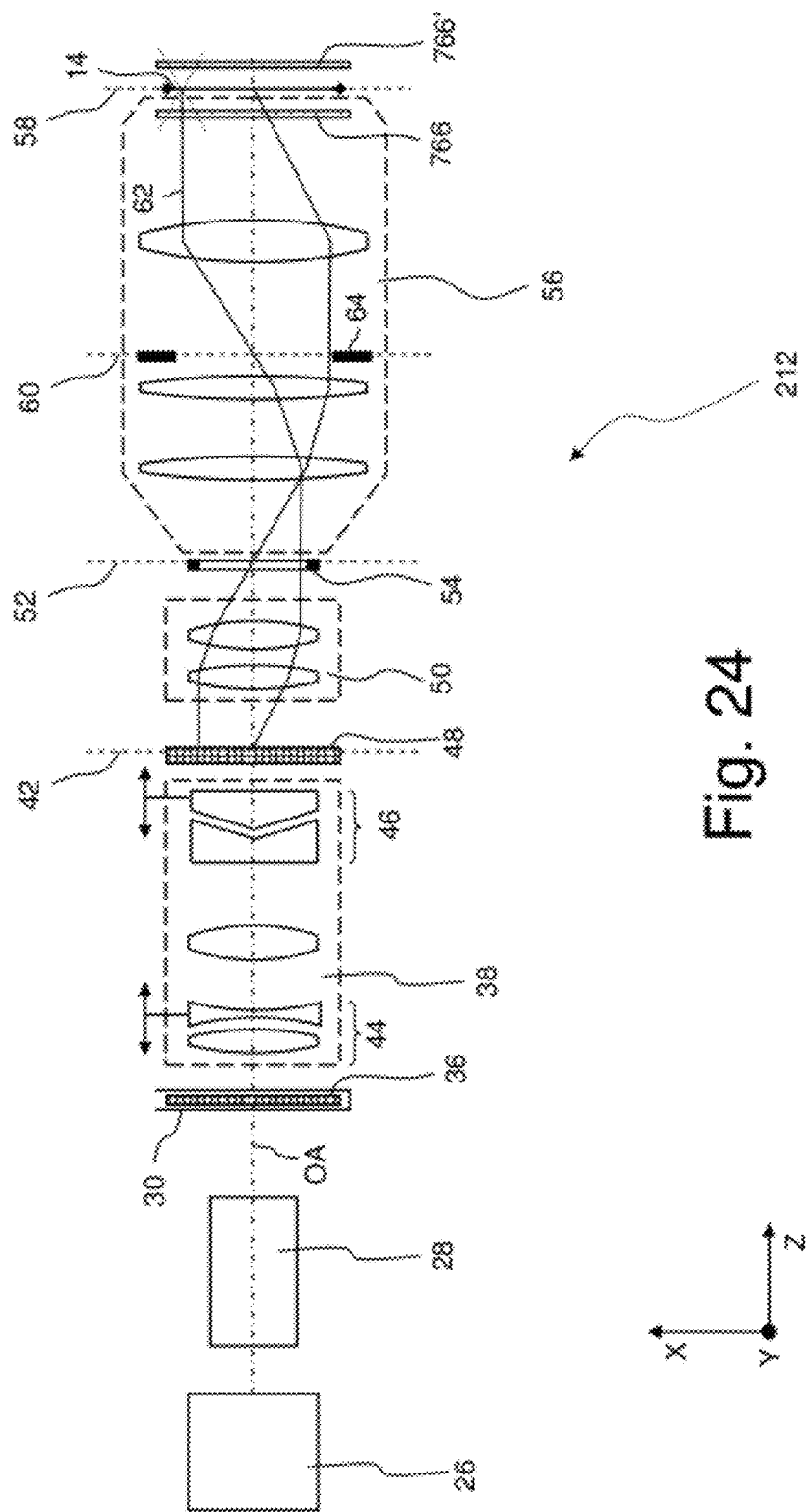
FIG. 24 is a meridional section through an illumination system of the projection exposure apparatus shown in FIG. 1.

FIG. 24 is a meridional section through an illumination system of the projection exposure apparatus shown in FIG. 1 according to another exemplary embodiment. Since the illumination system, which is denoted in its entirety by 212, is to a large extent similar to the illumination system 112 shown in FIG. 19, parts corresponding to one another are provided with the same reference numerals.

Figure 25:
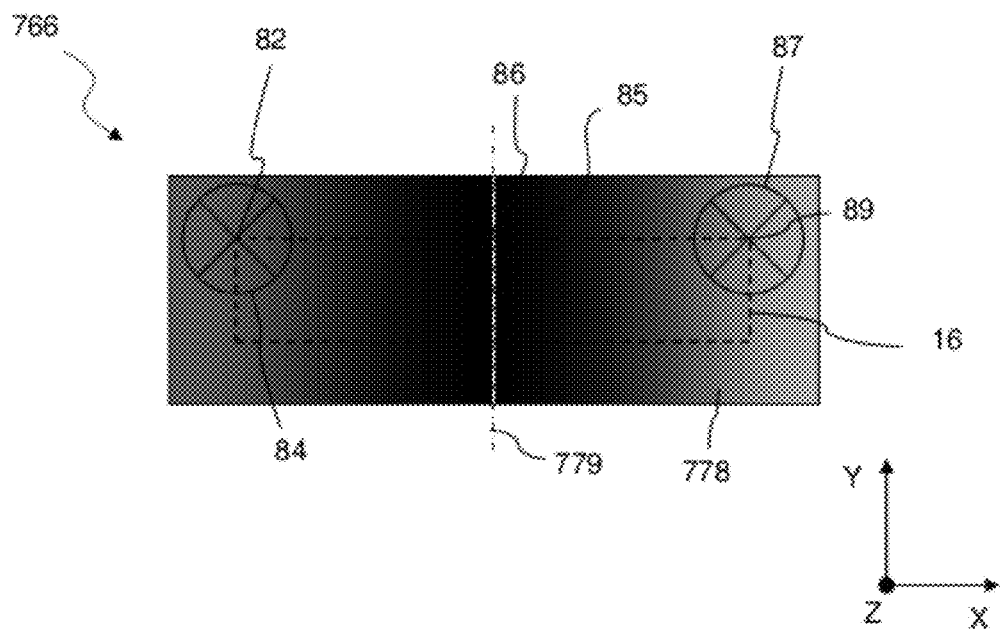
FIG. 25 is a plan view of a first transmission filter for the illumination system shown in FIG. 24.

The illumination system 212 also has a first and second transmission filter 766, 766' which are identical and contain only one filter region 778, as is shown in the top views of FIGS. 25 and 25. However, the filters are not separated by the second pupil plane 60, but by the mask plane 58. Thus the first transmission filter 766 is arranged between the second pupil plane 60 and the mask plane 58, and the second transmission filter 766' is arranged between the mask plane 58 and the projection objective 20 (not shown in FIG. 24). In this exemplary embodiment the first transmission filter 766 is mounted inside a housing of the illumination system 212, whereas the second transmission filter 766' is mounted in the interspace between the illumination system 212 and the projection objective 20 (not shown in FIG. 24). The second transmission filter 766' may be fixed to a frame that also accommodates the mask 14 so that it is moved by a mask stage during the projection operation. In other exemplary embodiments the second transmission filter 766' is received in a mounting frame that is fixedly (but desirably adjustably) attached with respect to the illumination system 212 and the projection objective 20 so that it cannot move during the projection operation. In a still further exemplary embodiment shown in FIG. 25 both the first and the second transmission filters are arranged in the interspace between the illumination system 212 and the projection objective 20.

The separation by a field plane implies that there the corresponding positions on the first and second transmission filters 766, 766' are not point-symmetric images of one another, as is the case in the exemplary embodiment shown in FIG. 19. Instead, a light bundle that passes through the first transmission filter 766 through, say, the upper left corner passes through the second transmission filter 766' also through its upper left corner. However, the field plane nevertheless results in an "internal" inversion of each light bundle in the sense that rays propagating along one side on the bundle propagate on the opposite side of the bundle after they have passed through the mask plane 58.

Another difference to the illumination system 112 shown in FIG. 19 is that the transmission filters 766, 766' have a transmission profile which is not symmetrical with respect to a plane 779 which contains the optical axis OA. This can be gleaned from FIGS. 25 and 27 and also from FIG. 26 which is a graph illustrating the nonlinear dependency of the absorption coefficient $A=1-T$ (with negligible reflection) on the x coordinate for both filters. In this exemplary embodiment the transmission profile is defined such that the absorption increases more rapidly with increasing distance from the centre (x=0) along the +x direction than along the −x direction. With such a distribution of the transmittance, it is possible to correct a pupil ellipticity which has not a symmetrical field dependency as shown in FIG. 5. It is to be noted, however, that such a non-symmetrical profile could equally be used in the exemplary embodiment shown in FIG. 19.

In order to explain the function of the two transmission filters 766, 766', reference will be made to FIGS. 25 and 27. In a representation corresponding to FIG. 20, FIG. 25 shows light bundles 84, 85, 87 which converge respectively at mask points 82, 86, 89 in the mask plane 58. The constellation is in each case represented at the time when the illumination of the mask points 82 and 86 during the scan process begins.

Figure 27:
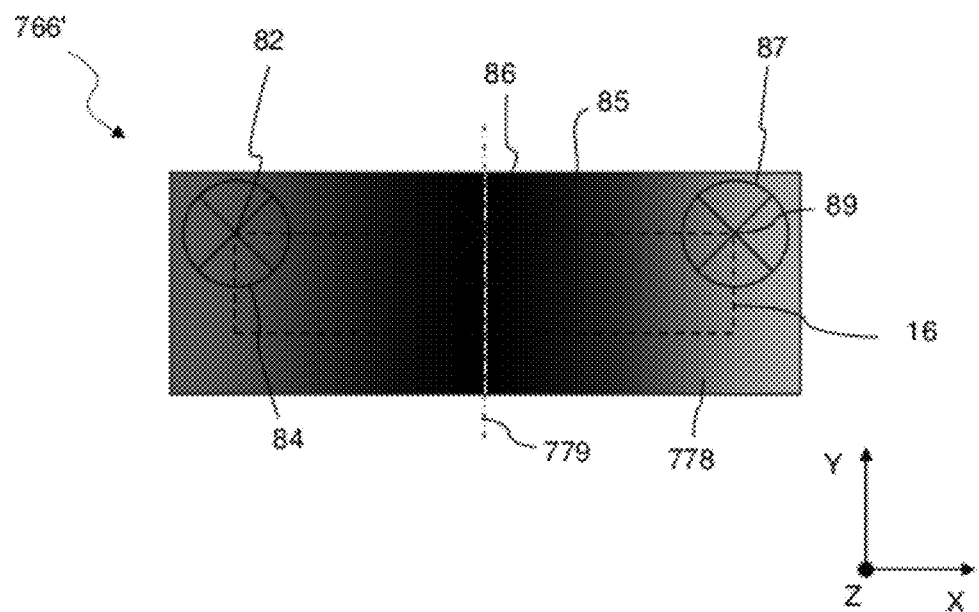
FIG. 27 is a plan view of a second transmission filter for the illumination system shown in FIG. 24.

As can be established by comparing FIGS. 25 and 27, the light bundles 84, 85, 87 pass through identical portions on the transmission filters 766 and 766' at the same time. In the following the mask point 82 lying at the outer side edge of the illuminated field 16 is considered first. The light bundle 84 which converges on the mask point 82 passes through the first transmission filter 766 in the upper left corner of the field illuminated on the transmission filter 766. On the second transmission filter 766' the same applies, i.e. the light bundle passes through the upper left corner of the field illuminated on the transmission filter 766. This is a consequence of the aforementioned separation of the transmission filters 766, 766' by a field plane, namely the mask plane 56.

Figure 26:
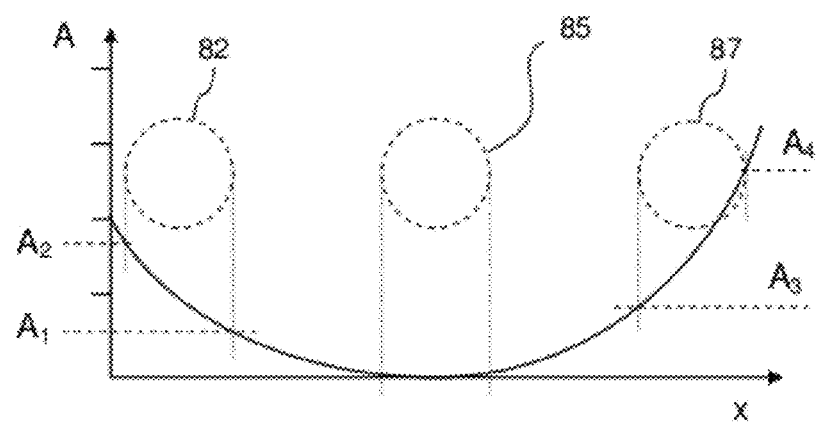
FIG. 26 is a graph in which the dependency of the absorption on the x coordinate is plotted.

The way in which this affects the pupil ellipticity will be made clear with the aid of the graphs shown in FIGS. 26, 28 and 29. When the light bundle 84 passes through the first transmission filter 766, it experiences an absorption with absorption coefficients between $A_1$ and $A_2$, as shown on the left in FIG. 26. When the light bundle 84 passes through the second transmission filter 766', it experiences an absorption with absorption coefficients between $A_3$ and $A_4$ as a result of the internal inversion mentioned above. This is illustrated in the graph shown in FIG. 28, in which the absorption profiles experienced by the bundle 84 when passing through the two transmission filters 766, 766' are superimposed (see dashed lines). Superimposing the two absorption profiles leads to the curve represented by a solid line, which is symmetrical with respect to the line 799 represented by dots and dashes.

Figures 28, 29:
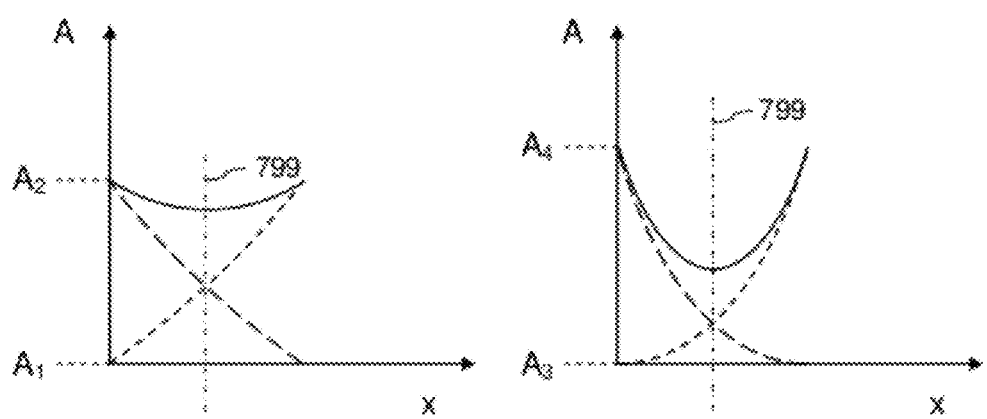
FIG. 28 is a graph in which the dependencies of the absorption on the x coordinate for the two transmission filters are superimposed for a light bundle associated with a first field point.
FIG. 29 is a graph in which the dependencies of the absorption on the x coordinate for the two transmission filters are superimposed for a light bundle associated with a second field point.

The light bundle 84 will therefore be attenuated by the combination of the two transmission filters 766, 766' in the same way as if it were to pass through a single transmission filter which has the absorption distribution shown by a solid line in FIG. 28 and being symmetrical with respect to the line 799. The effect of this absorption distribution, which is symmetrical for any light bundle, is that light rays which pass through the horizontal segments H1, H2 are attenuated more strongly than light rays which pass through the vertical segments V1, V2. The pupil ellipticity is therefore increased according to Eq. (1), so that the pupil ellipticity E can be brought close to the value 1 (optionally by using an additional transmission filter in a pupil plane). Owing to the symmetrical absorption distribution, moreover, the position of the principal ray as an energetically central ray (centroid ray) of the light bundle, and therefore the telecentric properties, are preserved at the same time.

The corrective effect is also field-dependent in this exemplary embodiment, since the transmittance of the first filter regions 778, 778' varies along the X direction. For example, the light bundle 85 assigned to the mask point 86 being situated on the line 779 experiences only a minor correction of the pupil ellipticity, since the transmittance is modified only relatively weakly in the vicinity of the plane 779.

A light bundle 87 assigned to a mask point 81 at the upper right corner will be modified in a different way if compared with the light bundle 84. Since the absorption coefficient A of the transmission filters 766, 766' increases more rapidly with increasing +x values than for increasing −x values, the total transmission experienced by the bundle 87 when passing through both filter elements 766, 766' will also vary more strongly along the x direction. This is illustrated in FIG. 29 which is a graph similar to what is shown in FIG. 28 for the light bundle 84.

Since the total radiation dose arriving on the mask points is influenced field-dependently by the two transmission filters 766, 766', additional measures desirably are taken in order to preserve the radiation dose. The use of adjustable field diaphragms may for example be envisaged, as explained above in connection with FIG. 10.

Figure 30:
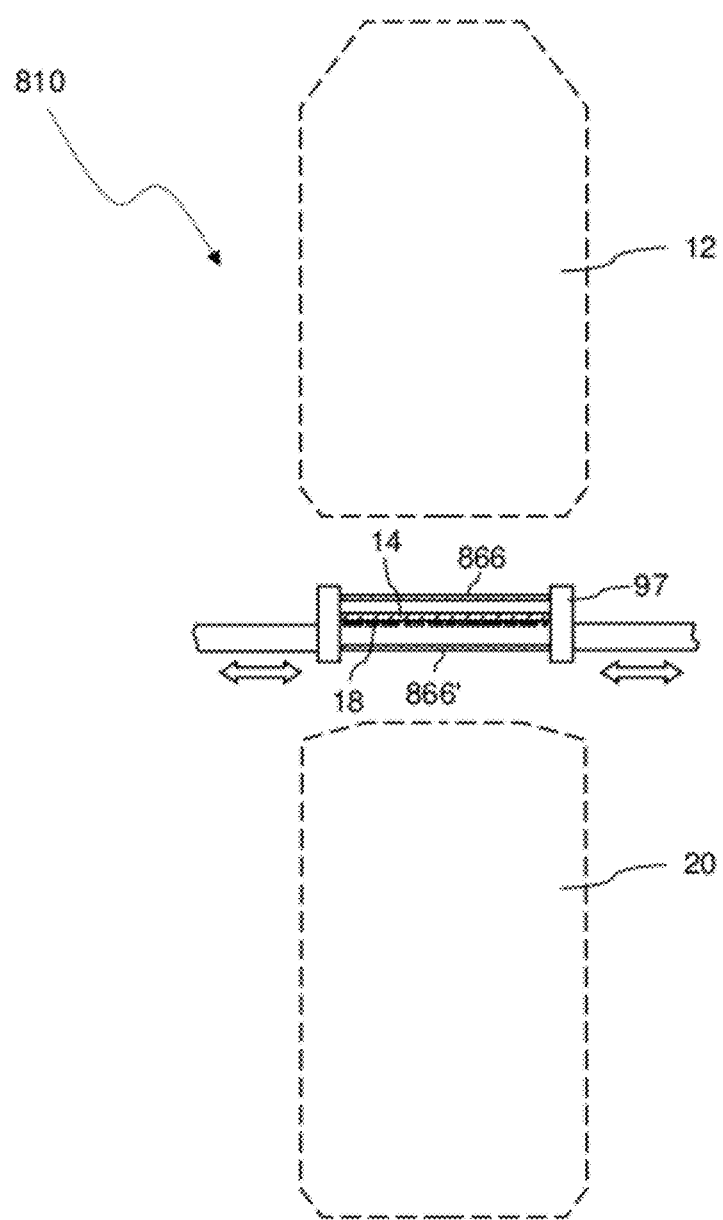
FIG. 30 is a simplified illustration of a microlithographic projection exposure apparatus in which two transmission filters are arranged on opposite sides of a mask.

FIG. 30 is a schematic illustration of a projection exposure apparatus 810 according to still another exemplary embodiment which is, from a functional point of view, equivalent to the exemplary embodiment shown in FIG. 24. The only difference is that both transmission filters 866, 866' are arranged between the illumination system 12 and the projection objective 20. To this end the transmission filters 866, 866' are attached to a frame 97 that also holds the mask 14 containing the structures 18. In this exemplary embodiment the transmission filters 866, 866' are arranged at equal distances from the structures 18 applied to the mask 14 so that the latter is sandwiched between the filters. Thus a pellicle which is usually provided to protect the mask from dust and other environmental influences may be dispensed with.

The arrangement of transmission filters 866, 866' outside the illumination system 12 and the projection objective 20 has the advantage that the transmission filters 866, 866' may be retrofitted in existing apparatus. Only the frame 97 holding the mask 14 desirably are modified such that it can also accommodate the two transmission filters 866, 866'.

The above description of exemplary embodiments has been given by way of example. From the disclosure given, those skilled in the art will not only understand the disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

What is claimed is:

1. An apparatus having a plurality of pupil planes and a plurality of field planes, the apparatus comprising:
    a first transmission filter having a first spatial transmittance distribution; and
    a second transmission filter having a second spatial transmittance distribution, wherein:
        the first spatial transmittance distribution is identical to the second spatial transmittance distribution, or the first spatial transmittance distribution is a magnified image of the second spatial transmittance distribution,
    the first and second transmission filters are separated from each other by either: a) n pupil planes and n+1 or n−1 field planes; or b) m field planes and m+1 or m−1 pupil planes;
        wherein n is an odd integer;
    m is an even integer distinct from zero;
    the field planes are conjugate to a mask plane;
    the pupil planes have a Fourier relation to the field planes; and
    the apparatus is a microlithographic projection exposure apparatus.

2. The apparatus of claim 1, wherein the two transmission filters are separated from each other by n pupil planes and n+1 or n−1 field planes, and the two transmission filters have spatial transmittance distributions that are mirror-symmetric with respect to a symmetry plane.

3. The apparatus of claim 1, wherein the two transmission filters are separated from each other by one pupil plane contained in an objective that is configured to image a field stop on a mask plane.

4. The apparatus of claim 1, wherein the transmission filters are separated only by a mask plane.

5. The apparatus of claim 4, further comprising:
    a holder that holds the transmission filters; and
    a mask to be imaged during use of the apparatus.

6. The apparatus of claim 1, wherein the two transmission filters are arranged in planes where light bundles converging towards points in a field plane have equal diameters.

7. Apparatus of one claim 1, wherein the apparatus is configured to move a mask during exposure operation along a scan direction.

8. The apparatus of claim 7, wherein a transmittance of the two transmission filters varies only perpendicularly to the scan direction.

9. The apparatus of claim 7, wherein the two transmission filters have spatial transmittance distributions that are mirror-symmetric with respect to a symmetry axis which extends parallel to the scan direction.

10. The apparatus of claim 8, wherein the transmittance of the two transmission filters decreases nonlinearly perpendicularly to the scan direction with an increasing distance from an optical axis of the apparatus.

11. An apparatus having a plurality of pupil planes and a plurality of field planes, the apparatus comprising:
    two transmission filters having spatial transmittance distributions so that a combination of the two transmission filters has different effects on the ellipticity, but not on the telecentricity, of two light bundles which pass through both transmission filters and converge towards two different points in a field plane,
    wherein:
        the two transmission filters are separated by: a) n pupil planes and n+1 or n−1 field planes; or b) m field planes and m+1 or m−1 pupil planes;
        n is an odd integer;
        m is an even integer distinct from zero;
        the field planes are conjugate to a mask plane;
        the pupil planes have a Fourier relation to the field planes;
        ellipticity is a ratio of light which strike a field point on the mask plane from orthogonal directions during operation of the apparatus;
        telecentricity is an extent by which energetically central rays of a light bundle pass perpendicularly through the mask plane, and
        the apparatus is a microlithographic projection exposure apparatus.

12. The apparatus of claim 1, comprising an illumination system and a projection objective, wherein the projection objective is configured to project an object in one of the field planes of the illumination system into an image plane of the projection objective.

13. The apparatus of claim 12, wherein the two transmission filters are in the illumination system.

14. The apparatus of claim 4, comprising an illumination system and a projection objective, wherein the projection objective is configured to project an object in the mask plane into an image plane of the projection objective.

15. The apparatus of claim 14, further comprising:
    a holder that holds the transmission filters; and
    a mask to be imaged during use of the apparatus.

16. A method, comprising:
    using an apparatus to form microstructured components, wherein the apparatus is an apparatus according to claim 1.

17. The apparatus of claim 11, comprising an illumination system and a projection objective, wherein the projection objective is configured to project an object in one of the field planes of the illumination system into an image plane of the projection objective.

18. The apparatus of claim 17, wherein the two transmission filters are in the illumination system.

19. The apparatus of claim 11, further comprising:
    a holder that holds the transmission filters; and
    a mask to be imaged during use of the apparatus.

20. A method, comprising:
using an apparatus to form microstructured components, wherein the apparatus is an apparatus according to claim 11.

* * * * *

UNITED STATES PATENT AND TRADEMARK OFFICE
CERTIFICATE OF CORRECTION

| | |
|---|---|
| PATENT NO. | : 9,116,441 B2 |
| APPLICATION NO. | : 13/438179 |
| DATED | : August 25, 2015 |
| INVENTOR(S) | : Nils Dieckmann et al. |

Page 1 of 1

It is certified that error appears in the above-identified patent and that said Letters Patent is hereby corrected as shown below:

In the specification

Col. 11, line 52, delete "$D_{v1}, D_{v2}$" and insert -- $D_{v1}, D_{v2}$ --.

In the claims

Col. 22, line 1, Claim 7, delete "Apparatus of one" and insert -- The apparatus of --.

Signed and Sealed this
Twenty-second Day of March, 2016

Michelle K. Lee
*Director of the United States Patent and Trademark Office*